United States Patent
Kao et al.

(10) Patent No.: US 9,923,011 B2
(45) Date of Patent: Mar. 20, 2018

(54) SEMICONDUCTOR DEVICE STRUCTURE WITH STACKED SEMICONDUCTOR DIES

(71) Applicant: Taiwan Semiconductor Manufacturing Co., Ltd., Hsinchu (TW)

(72) Inventors: Min-Feng Kao, Chiayi (TW); Dun-Nian Yaung, Taipei (TW); Jen-Cheng Liu, Hsinchu (TW); Hsun-Ying Huang, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/993,748

(22) Filed: Jan. 12, 2016

(65) Prior Publication Data
US 2017/0200756 A1 Jul. 13, 2017

(51) Int. Cl.
*H01L 27/146* (2006.01)
*H01L 23/48* (2006.01)

(52) U.S. Cl.
CPC ...... *H01L 27/14634* (2013.01); *H01L 23/481* (2013.01); *H01L 27/14636* (2013.01)

(58) Field of Classification Search
CPC ......... H01L 27/14634; H01L 27/14636; H01L 27/10; H01L 27/0922; H01L 27/115; H01L 23/481
USPC ........................ 257/292, 414, 444
See application file for complete search history.

(56) References Cited

U.S. PATENT DOCUMENTS

| | | | |
|---|---|---|---|
| 9,184,198 B1 | 11/2015 | Miao et al. | |
| 2011/0019045 A1* | 1/2011 | Lin | H01L 27/14612 348/296 |
| 2013/0285180 A1* | 10/2013 | Wang | H01L 27/14618 257/432 |
| 2014/0087557 A1* | 3/2014 | Gambino | G06F 17/5077 438/656 |
| 2014/0138521 A1* | 5/2014 | Liu | H01L 27/14618 250/208.1 |
| 2015/0028479 A1* | 1/2015 | Ebefors | H01L 23/147 257/738 |
| 2015/0076649 A1* | 3/2015 | Kim | H01L 27/14609 257/446 |

* cited by examiner

*Primary Examiner* — Johannes P Mondt
(74) *Attorney, Agent, or Firm* — Eschweiler & Potashnik, LLC

(57) ABSTRACT

A semiconductor device structure is provided. The semiconductor device structure includes a first semiconductor die and a second semiconductor die. The semiconductor device structure also includes a passivation layer between the first semiconductor die and the second semiconductor die, and the passivation layer is directly bonded to a second interlayer dielectric layer of the second semiconductor die. The semiconductor device structure further includes a conductive feature in via hole and directly bonded to a second conductive line of the second semiconductor die. The semiconductor device structure further includes a second barrier layer between the conductive feature and the passivation layer. The second barrier layer covers sidewalls of the conductive feature and a surface of the conductive feature closer to the first semiconductor die.

18 Claims, 23 Drawing Sheets

SEMICONDUCTOR DEVICE STRUCTURE WITH STACKED SEMICONDUCTOR DIES

BACKGROUND

Semiconductor devices are used in a variety of electronic applications, such as personal computers, cell phones, digital cameras, and other electronic equipment. The fabrication of semiconductor devices involves sequentially depositing insulating or dielectric layers, conductive layers, and semiconductor layers over a semiconductor substrate, and patterning the various material layers using lithography and etching processes to form circuit components and elements on the semiconductor substrate.

The semiconductor industry continues to improve the integration density of various electronic components (e.g., transistors, diodes, resistors, capacitors, etc.) by continual reductions in minimum feature size, which allows more components to be integrated into a given area. The number of input and output (I/O) connections is significantly increased. Smaller package structures, that utilize less area or smaller heights, are developed to package the semiconductor devices. For example, in an attempt to further increase circuit density, three-dimensional (3D) ICs have been investigated.

New packaging technologies have been developed to improve the density and functionality of semiconductor devices. These relatively new types of packaging technologies for semiconductor devices face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
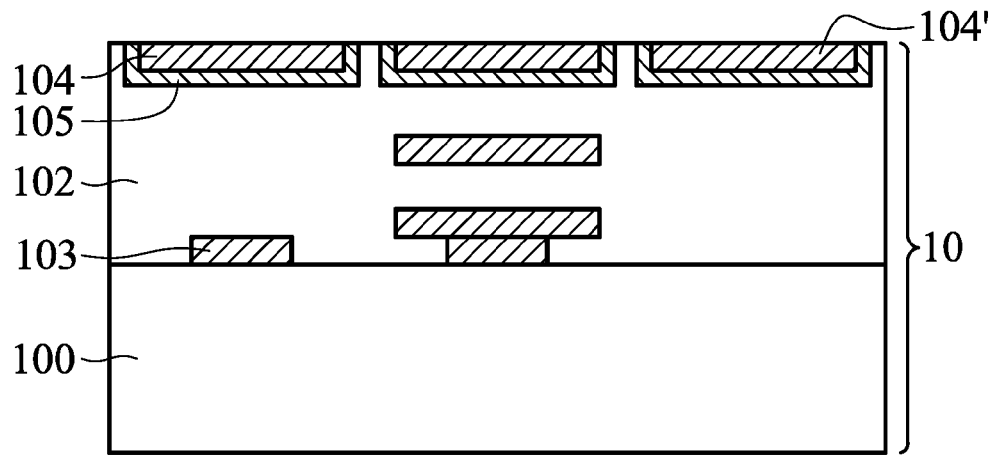
FIGS. 1A-1E are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1E are cross-sectional views of various stages of a process for forming a chip package, in accordance with some embodiments. As shown in FIG. 1A, a substrate 10 is provided. In some embodiments, the substrate 10 includes a semiconductor wafer, a portion of a semiconductor wafer, or a semiconductor die. The semiconductor wafer (such as a silicon wafer) may contain device elements such as active devices and/or passive devices.

In some embodiments, the substrate 10 includes a semiconductor substrate 100 and an interconnection structure formed on the semiconductor substrate 100, as shown in FIG. 1A. The interconnection structure includes an interlayer dielectric layer 102 and multiple conductive features including conductive lines 104, conductive vias (not shown), and conductive contacts 103. The interlayer dielectric layer 102 includes multiple dielectric sub-layers. Multiple conductive features such as contacts (such as the conductive contacts 103), conductive vias (not shown), and conductive lines (such as the conductive lines 104) are formed in the interlayer dielectric layer 102. Some of the conductive lines 104 may include wider portions. The wider portions may be used as conductive pads.

In some embodiments, barrier layers are formed between the conductive features and the interlayer dielectric layer 102. For simplicity, only some of the barrier layers such as barrier layers 105 are shown in FIG. 1A. Each of the barrier layers 105 covers sidewalls and a bottom surface of one of the conductive features 104. The barrier layers are also between some of the conductive features. For example, some of the barrier layers are formed between a conductive via and a conductive line that are adjacent to each other. The barrier layers may be made of TiN, TaN, Ta, Ti, TiW, another suitable material, or a combination thereof.

Figure 1B:
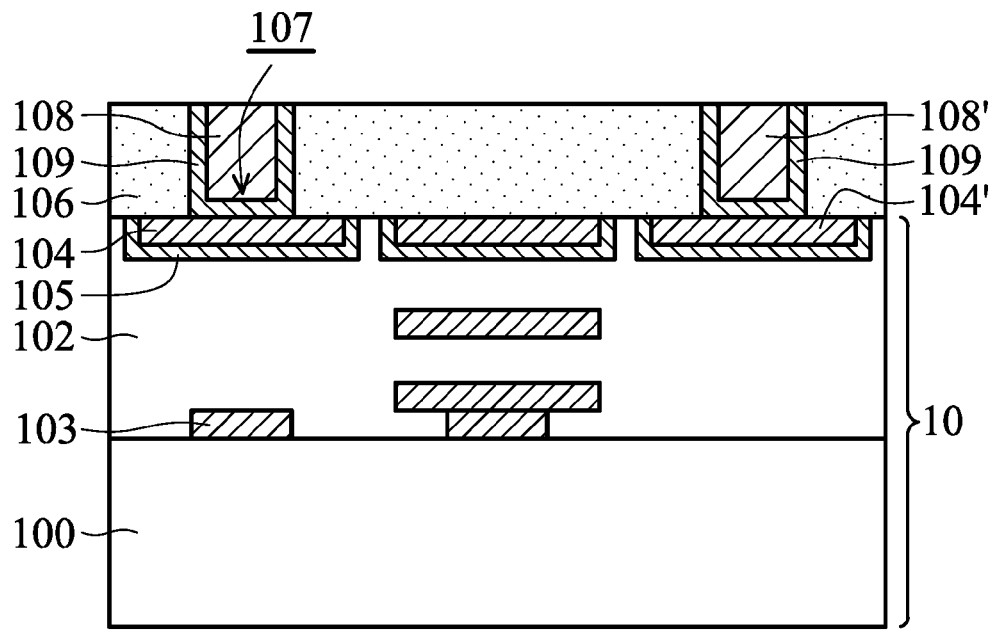

The formation of the interconnection structure may involve multiple deposition, patterning, and planarization processes. The planarization processes may include chemical mechanical polishing (CMP) processes. In some embodiments, a planarization process is performed such that the top surfaces of some of the conductive lines 104 are exposed and substantially coplanar with the top surface of the interlayer dielectric layer 102. The conductive lines 104 that are exposed may also be called top metals. In some embodiments, one of the barrier layers 105 covers the sidewalls and the bottom surface of one of the conductive features 104, as shown in FIG. 1B.

In some embodiments, various device elements are formed in the semiconductor substrate 100. Examples of the various device elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, or other suitable elements. Various processes may be used to form the various device elements, including deposition, etching, implantation, photolithography, annealing, and/or other suitable processes.

The device elements are interconnected through the interconnection structure over the semiconductor substrate 100 to form integrated circuit devices. For example, one of the conductive lines 104 may be electrically connected to a doped region formed in the semiconductor substrate 100 through some of the conductive vias, some other conductive lines 104, and one of the conductive contacts 103. The integrated circuit devices include logic devices, memory devices (e.g., static random access memories, SRAMs), radio frequency (RF) devices, input/output (I/O) devices, system-on-chip (SoC) devices, image sensor devices, other applicable types of devices, or a combination thereof.

As mentioned above, some of the conductive lines 104 form electrical connections to the device elements formed in the semiconductor substrate 100. However, it should be appreciated that embodiments of the disclosure are not limited thereto. In some embodiments, one or more dummy lines 104' are also formed in the interlayer dielectric layer 102, as shown in FIG. 1A. In FIG. 1A, only one of the dummy lines 104' is shown. In some embodiments, the top surface of one of the dummy lines 104' is substantially coplanar with the top surfaces of some of the conductive lines 104 and the interlayer dielectric layer 102. In some embodiments, the dummy lines 104' facilitate the planarization operations during the formation of the conductive lines 104. In some embodiments, the dummy lines 104' facilitate a subsequent bonding process with another semiconductor substrate (such as a semiconductor wafer or a semiconductor die).

As shown in FIG. 1B, a passivation layer 106 is deposited over the interlayer dielectric layer 102 and the conductive lines 104, in accordance with some embodiments. In some embodiments, the passivation layer 106 is deposited directly on the interlayer dielectric layer 102 and the conductive lines 104. In some embodiments, the passivation layer 106 includes multiple sub-layers. Each of the sub-layers of the passivation layer 106 may be made of silicon oxide, silicon oxynitride, silicon nitride, borosilicate glass (BSG), phosphoric silicate glass (PSG), borophosphosilicate glass (BPSG), fluorinated silicate glass (FSG), low-k material, another suitable material, or a combination thereof. The passivation layer 106 may be deposited using a chemical vapor deposition (CVD) process, an atomic layer deposition (ALD) process, a spin-on process, another applicable process, or a combination thereof. In some embodiments, a planarization process is used to provide the passivation layer 106 with a substantially planar top surface. In some other embodiments, the passivation layer 106 is a single layer.

Afterwards, via holes 107 are formed in the passivation layer 106, as shown in FIG. 1B in accordance with some embodiments. In some embodiments, the via holes 107 penetrate through the passivation layer 106. In some embodiments, one of the via holes 107 exposes one of the conductive lines 104. In some embodiments, one of the via holes 107 exposes one of the dummy lines 104'. In some embodiments, each of the conductive lines 104 exposed by the via holes 107 is wider than the corresponding one of the via holes 107. In some embodiments, a direct projection of each of the via holes 107 on the plane where top surfaces of the conductive lines 104 are positioned is completely within the region of the corresponding one of the conductive lines 104. The direct projection of each of the via holes 107 is completely positioned on the top surface of the corresponding one of the conductive lines 104.

In some embodiments, a photolithography process and an etching process are used to form the via holes 107. In some embodiments, the sidewalls of the via holes 107 are substantially perpendicular to the top surface of the passivation layer 106. In some other embodiments, the via holes 107 have slanted sidewalls. In some embodiments, each of the via holes 107 gradually becomes wider along a direction extending from one of the conductive lines 104 towards the top surface of the passivation layer 106. In some embodiments, each of the sidewalls of the via holes 107 as a whole has a uniform slope. In some embodiments, the via holes 107 are formed using only one photolithography process and only one etching process.

In some embodiments, a barrier material layer is deposited over the passivation layer 106 and the sidewalls and bottoms of the via holes 107. The barrier material layer may be made of TiN, TaN, Ta, Ti, TiW, another suitable material, or a combination thereof. The barrier material layer may be deposited using a physical vapor deposition (PVD) process, a CVD process, an electroplating process, an electroless plating process, another applicable process, or a combination thereof.

In some embodiments, a conductive material layer is then deposited over the barrier material layer. The conductive material layer may be made of copper, aluminum, tungsten, gold, platinum, cobalt, another suitable material, or a combination thereof. The conductive material layer may be deposited using an electroplating process, a CVD process, an electroless plating process, a PVD process, another applicable process, or a combination thereof.

In some embodiments, a planarization process is then used to remove the portions of the barrier material layer and the conductive material layer outside of the via holes 107. As a result, the remaining portions of the barrier material layer and the conductive material layer in the via holes 107 form barrier layers 109, conductive features 108, and one or more dummy features 108', as shown in FIG. 1B in accordance with some embodiments. In some embodiments, one of the barrier layers 109 covers sidewalls and a bottom surface of one of the conductive features 108, as shown in FIG. 1B.

In some embodiments, the conductive features 108 and the dummy features 108' are made of the same material. In FIG. 1B, only one of the conductive features 108 and one of the dummy features 108' are shown. In some embodiments, the top surface of the passivation layer 106 is substantially coplanar with the top surface of the conductive features 108 and the dummy features 108'.

Many variations and/or modifications can be made to embodiments of the disclosure. In some embodiments, the dummy features 108' are not formed. In some embodiments, the dummy lines 104' are not formed.

Figure 1C:
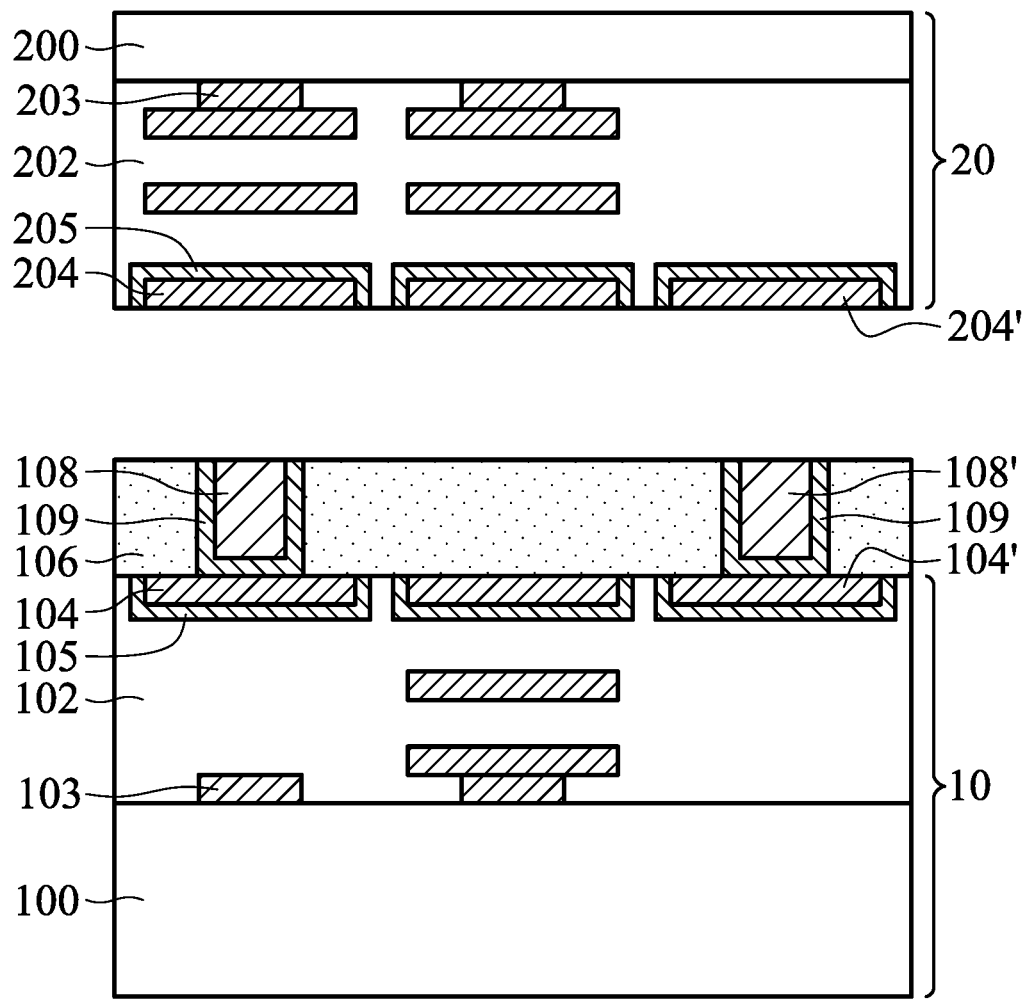

As shown in FIG. 1C, a substrate 20 is provided and flipped to be bonded onto the structure shown in FIG. 1B, in accordance with some embodiments. In some embodiments, the substrate 20 includes a semiconductor wafer, a portion of a semiconductor wafer, or a semiconductor die. The semiconductor wafer (such as a silicon wafer) may contain device elements such active devices and/or passive devices.

In some embodiments, the substrate 20 includes a semiconductor substrate 200 and an interconnection structure formed on the semiconductor substrate 200, as shown in FIG. 1C. The interconnection structures of the substrates 10 and 20 may be similar. The interconnection structure includes an interlayer dielectric layer 202 and multiple conductive features including conductive lines 204, conductive vias (not shown), and conductive contacts 203. Multiple conductive features such as contacts (such as conductive contacts 203), conductive vias (not shown), and conductive lines (such as the conductive lines 204) are formed in the interlayer dielectric layer 202. In some embodiments, barrier layers (such as barrier layers 205) are formed between the conductive features and the interlayer dielectric layer 202.

In some embodiments, various device elements are formed in the semiconductor substrate 200. The device elements are interconnected through the interconnection structure over the semiconductor substrate 200 to form integrated circuit devices. For example, one of the conductive lines 204 may be electrically connected to a doped region formed in the semiconductor substrate 200 through some of the conductive vias, some other conductive lines 204, and one of the conductive contacts 203.

In some embodiments, one or more dummy lines 204' are formed in the interlayer dielectric layer 202. In FIG. 1C, only one of the dummy lines 204' is shown. In some embodiments, the top surface of one of the dummy lines 204' is substantially coplanar with the top surfaces of some of the conductive lines 204 and the interlayer dielectric layer 202.

Figure 1D:
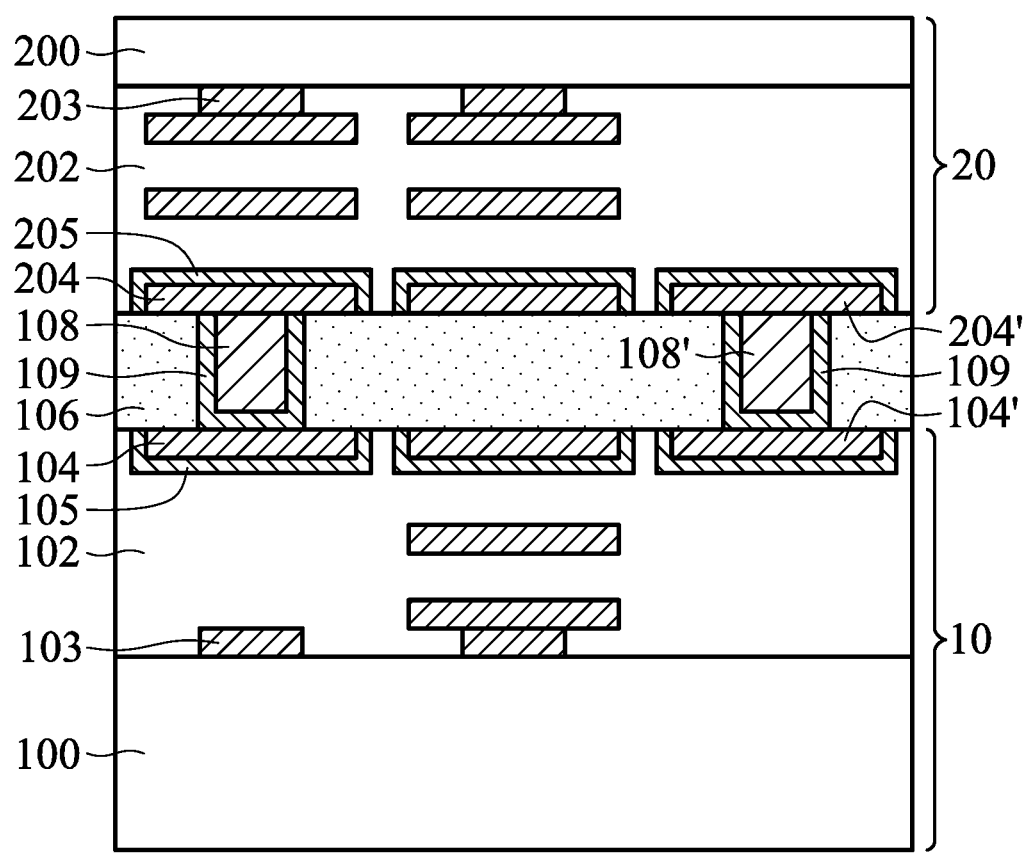

As shown in FIG. 1D, the substrate 20 is bonded on the passivation layer 106 such that the substrate 20 is in direct contact with the passivation layer 106 and the conductive features 108, in accordance with some embodiments. In some embodiments, each of the conductive features 108 is directly bonded to a corresponding one of the conductive lines 204. In some embodiments, each of the conductive features 108 is in direct contact with a corresponding one of the conductive lines 204. In some embodiments, the passivation layer 106 is directly bonded to the interlayer dielectric layer 202. In some embodiments, the surfaces of the passivation layer 106, the conductive features 108, and interlayer dielectric layer 102 are substantially coplanar, as shown in FIG. 1D. In some embodiments, surfaces of some of the conductive lines 104, the interlayer dielectric layer 102, the barrier layer 105, and the passivation layer 106 are substantially coplanar. In some embodiments, surfaces of the passivation layer 106, the conductive features 108, the barrier layers 109, the interlayer dielectric layer 202, some of the conductive lines 204, and the barrier layers 205 are substantially coplanar.

In some embodiments, the substrate 20 and the substrate 10 are bonded together through a hybrid bonding. The hybrid bonding may include an oxide-to-oxide bonding and a metal-to-metal bonding. In some embodiments, the substrate 20 is placed over the passivation layer 106, the conductive features 108, and the dummy features 108'. As a result, the passivation layer 106 is in direct contact with (or directly bonded to) the interlayer dielectric layer 202, some of the conductive lines 204, the barrier layers 205, and some of the dummy lines 204'. The conductive features 108 are in direct contact with the conductive lines 204, and the dummy features 108' are in direct contact with the dummy lines 204'. Afterwards, a heating operation may be used to achieve the hybrid bonding between these elements. During the hybrid bonding, the structure shown in FIG. 1D may be heated at a temperature in a range from about 300 degrees C. to about 450 degrees C.

In some embodiments, the substrates 10 and 20 are bonded together through the passivation layer 106, as shown in FIG. 1D. The conductive features 108 form electrical connections between device elements formed in the semiconductor substrates 100 and 200. The dummy features 108' bond the dummy lines 104' and 204'. In some embodiments, the formation of the conductive features 108 and the dummy features 108' involves only a single patterning process that is used for forming the via holes 107. The number of patterning processes is reduced. Therefore, the fabrication cost and time are significantly reduced.

In some embodiments, the passivation layer 106 is in direct contact with the interlayer dielectric layers 102 and 202. In some embodiments, there is no etch stop layer formed between the passivation layer 106 and the interlayer dielectric layer 102 or between the passivation layer 106 and the interlayer dielectric layer 202. In some embodiments, a planarization process is used to thin the semiconductor substrate 200 after the hybrid bonding process.

Figure 1E:
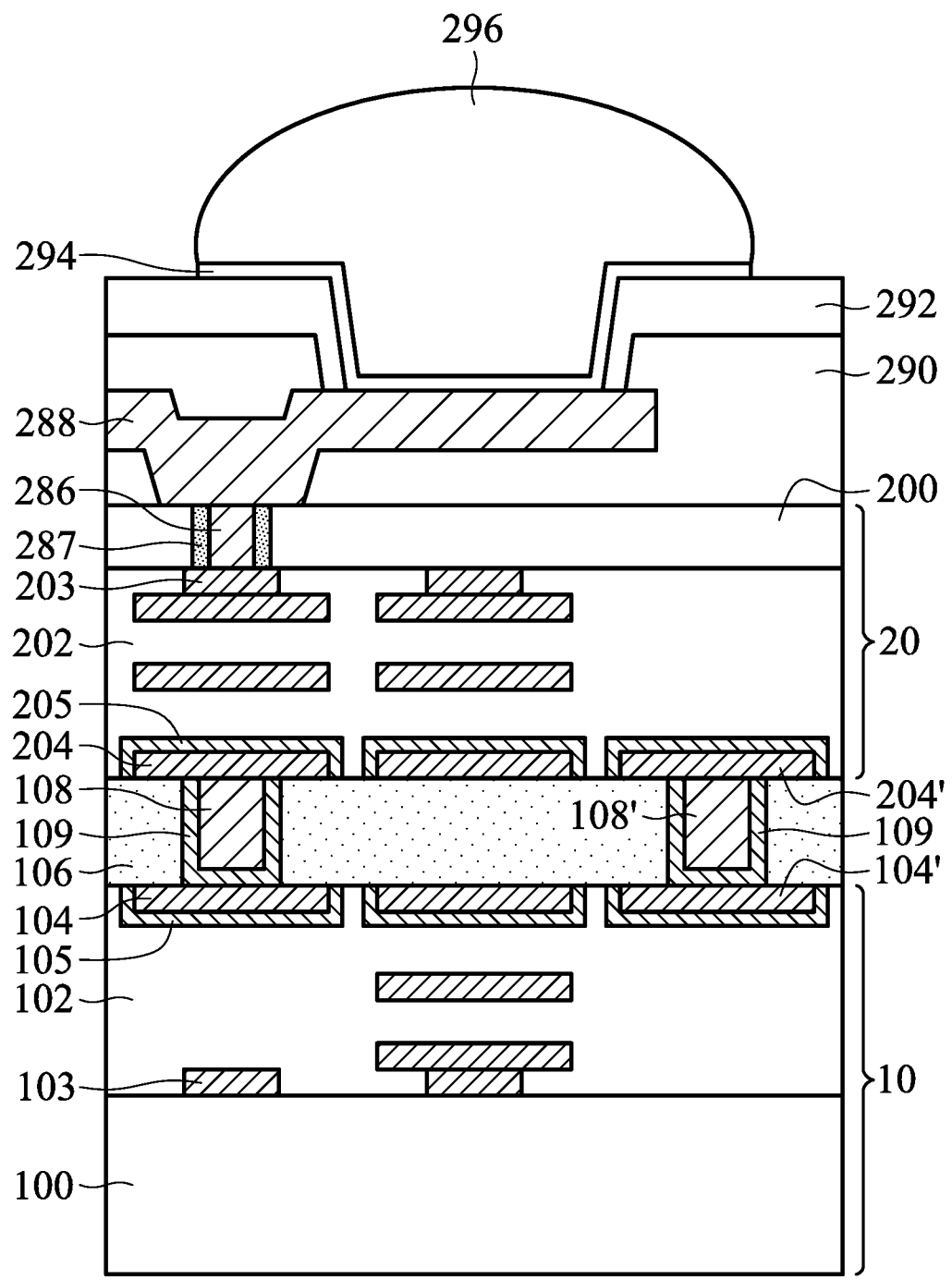

As shown in FIG. 1E, one or more through-substrate vias 286 are formed in the semiconductor substrate 200, in accordance with some embodiments. In FIG. 1D, only one of the through-substrate vias 286 is shown. In some embodiments, an insulating layer 287 is formed between one of the through-substrate vias 286 and the semiconductor substrate 200. In some embodiments, the semiconductor substrate 200 is thinned before the formation of the through-substrate vias 286. The semiconductor substrate 200 may be thinned using a CMP process, a grinding process, an etching process, another applicable process, or a combination thereof. The subsequent formation of the insulating layer 287 and the through-substrate vias 286 may be easier since the semiconductor substrate 200 is thinned.

In some embodiments, one of the through-substrate vias 286 is electrically connected to one of the conductive contacts 203. In some embodiments, one of the through-substrate vias 286 is electrically connected to one of the device elements formed in the semiconductor substrate 100 through the conductive contacts 203. In some embodiments, one of the through-substrate vias 286 is electrically connected to one of the conductive features 108 through some of the conductive features formed in the interlayer dielectric layer 202.

In some embodiments, the through-substrate vias 286 do not penetrate through the interlayer dielectric layer 202. In some embodiments, each the conductive features 108 is wider than each of the through-substrate vias 286. The through-substrate vias 286 do not occupy too large a region of the semiconductor substrate 200. Therefore, more device elements can be formed in the semiconductor substrate 200.

Afterwards, a first passivation layer 290, a redistribution layer 288, and a second passivation layer 292 are formed over the semiconductor substrate 200 and the through-substrate vias 286, as shown in FIG. 1E in accordance with some embodiments. In some embodiments, the first and second passivation layers 290 and 292 are made of silicon nitride, polyimide (PI), polybenzoxazole (PBO), another suitable material, or a combination thereof. In some embodiments, the redistribution layer 288 is made of Cu, Al, W, Au, Ti, Pt, Co, another suitable material, or a combination thereof. In some embodiments, the redistribution layer 288 is electrically connected to one of the through-substrate vias 286. In some embodiments, the first passivation layer 290 includes multiple sub-layers. The second passivation layer 292 is patterned to form an opening that exposes the redistribution layer 288. The formation of the first passivation layer 290, the redistribution layer 288, and the second passivation layer 292 may involve multiple deposition, patterning, and planarization processes.

As shown in FIG. 1E, a conductive bump 296 is formed to fill the opening in the second passivation layer 292, in accordance with some embodiments. The conductive bump 296 is electrically connected to the redistribution layer 288. In some embodiments, the conductive bump 296 is a solder bump. In some embodiments, an under bump metallization (UBM) layer 294 is formed over the sidewalls and bottom of the opening before the formation of the conductive bump 296. In some embodiments, the UBM layer 294 includes chromium (Cr), copper (Cu), gold (Au), titanium (Ti), tungsten (W), another suitable material, or a combination thereof.

In some embodiments, two stack semiconductor wafers are bonded through the passivation layer 106 and the conductive features 108. In some embodiments, a dicing process is performed on the stacked semiconductor wafers to form multiple package structures (or semiconductor device structures) that are separated from each other. In some embodiments, FIG. 1E shows one of the package structures (or semiconductor device structures). In these cases, the substrates 10 and 20 are a first semiconductor die and a second semiconductor die, respectively.

Figure 2A:
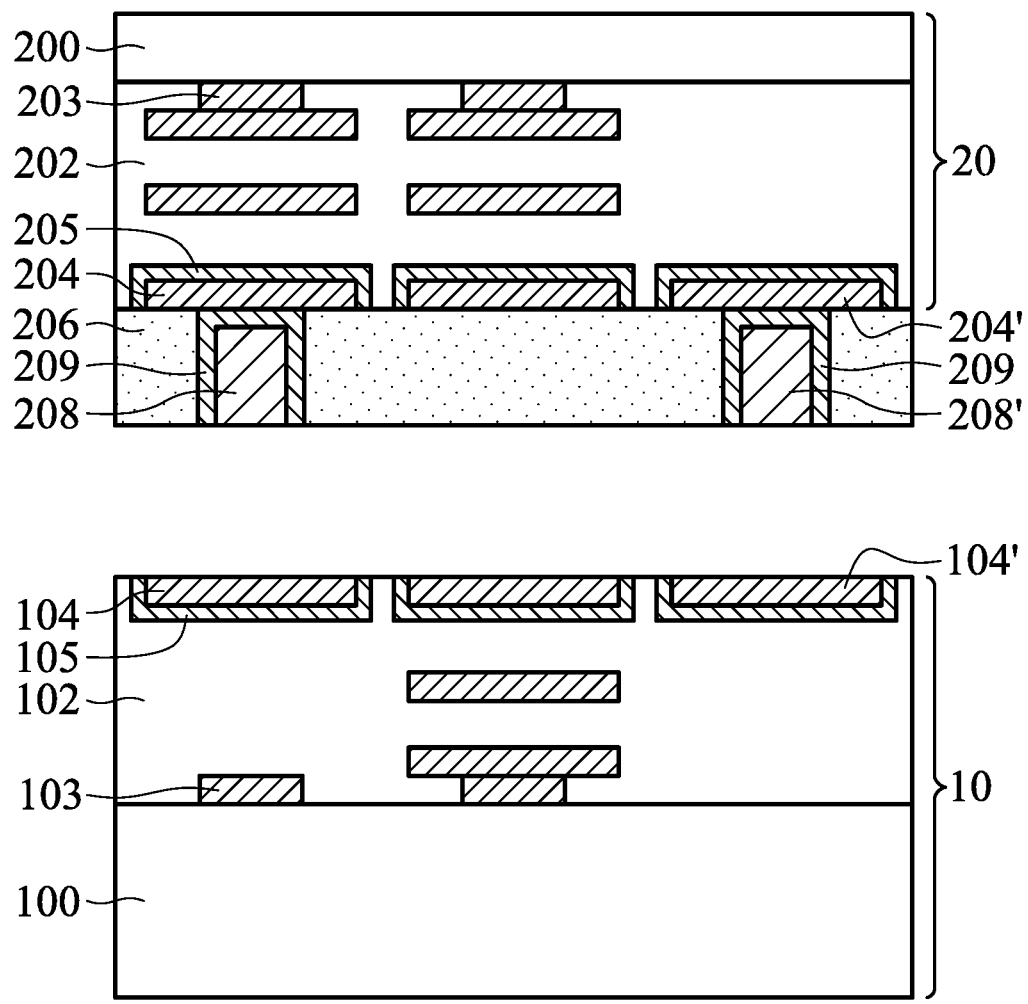
FIGS. 2A-2C are cross-sectional views of various stages of a process for forming a semiconductor device structure, in accordance with some embodiments.
Figure 2B:
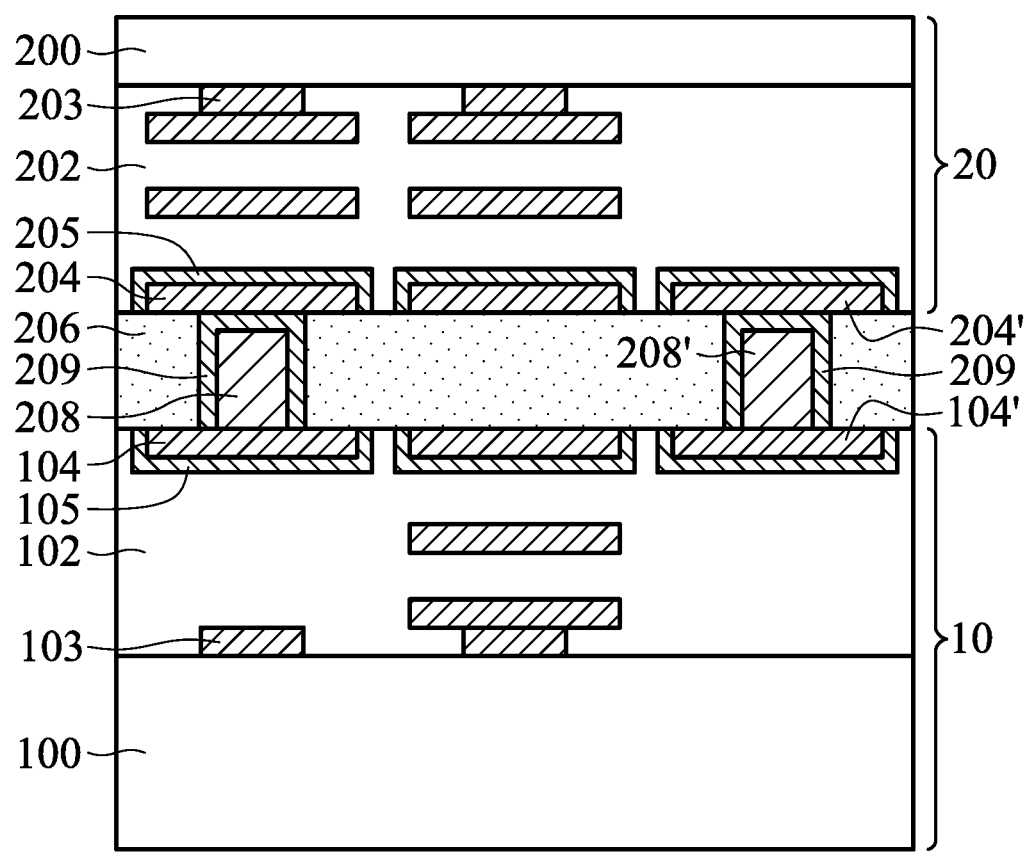
Figure 2C:
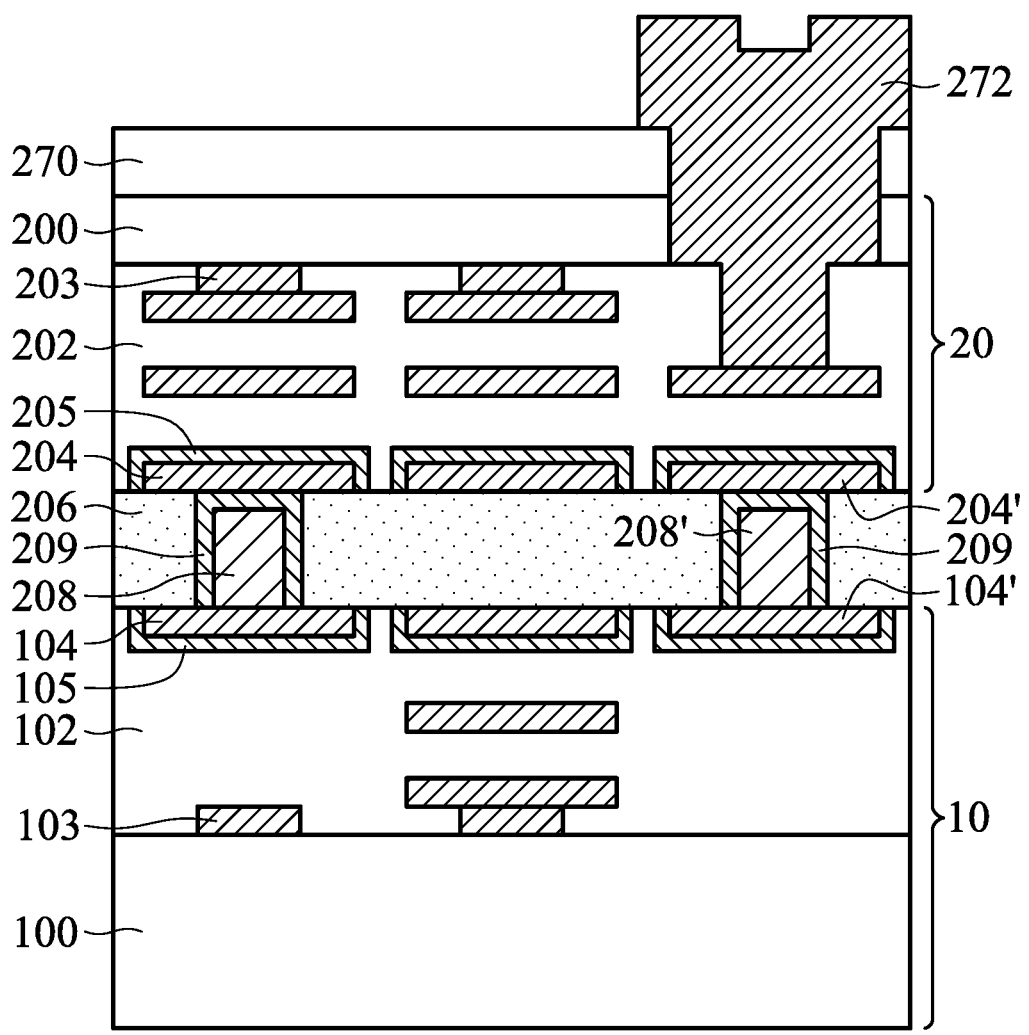

Many variations and/or modifications can be made to embodiments of the disclosure. In some embodiments, the passivation layer and the conductive feature are formed on an upper semiconductor wafer. FIGS. 2A-2C are cross-sectional views of various stages of a process for forming a semiconductor device structure, in accordance with some embodiments.

As shown in FIG. 2A, a passivation layer 206, one or more conductive features 208, and one or more dummy features 208' are formed on the substrate 20, in accordance with some embodiments. In FIG. 2A, only one of the conductive features 208 and one of the dummy features 208' are shown. In some embodiments, barrier layers (such as barrier layers 209) are formed between the passivation layer 206 and the conductive features 208 or between the passivation layer 206 and the dummy features 208'. In some embodiments, the materials and formation methods of the passivation layer 206, the conductive features 208, the dummy features 208', and the barrier layers 209 are similar to those of the passivation layer 106, the conductive features 108, the dummy features 108', and the barrier layers 109. Similar to that shown in FIG. 1C, the substrate 20 is flipped to be bonded onto the substrate 10. In some embodiments, both of the substrates 10 and 20 are semiconductor wafers, and FIG. 2A merely shows portions of the semiconductor wafers.

Similar to that shown in FIG. 1D, the substrate 20 is bonded onto the substrate 10 through the passivation layer 206, the conductive features 208, and the dummy features 208', as shown in FIG. 2B in accordance with some embodiments. In some embodiments, the conductive features 208 are directly bonded to and in direct contact with corresponding conductive lines 104 of the substrate 10, as shown in FIG. 2B.

As shown in FIG. 2C, a passivation layer 270 and a pad structure 272 are formed, in accordance with some embodiments. In some embodiments, the passivation layer 270 is made of silicon nitride, polyimide (PI), polybenzoxazole (PBO), another suitable material, or a combination thereof. Afterwards, a photolithography process and an etching process are applied to form an opening that penetrates through the passivation layer 270 and the semiconductor substrate 200. In some embodiments, the opening further extends into the interlayer dielectric layer 202 and exposes one of the conductive lines 204.

Afterwards, the pad structure 272 is formed in the opening to electrically connect the exposed one of the conductive lines 204, as shown in FIG. 2C in accordance with some embodiments. In some embodiments, the pad structure 272 is made of aluminum, tungsten, nickel, copper, titanium, gold, platinum, another suitable material, or a combination thereof. In some embodiments, a conductive material layer is deposited over the passivation layer 270 to fill the opening. Afterwards, the conductive material layer is patterned to form the pad structure 272. In some embodiments, the pad structure 272 is used as a wire bond pad for forming a wire bond thereon.

In some embodiments, the passivation layer and the conductive feature are formed on the interconnection structure of the substrate (or semiconductor wafer). However, embodiments of the disclosure are not limited thereto. In some embodiments, the passivation layer and the conductive feature are formed on the semiconductor substrate of the substrate (or semiconductor wafer).

Figure 3:
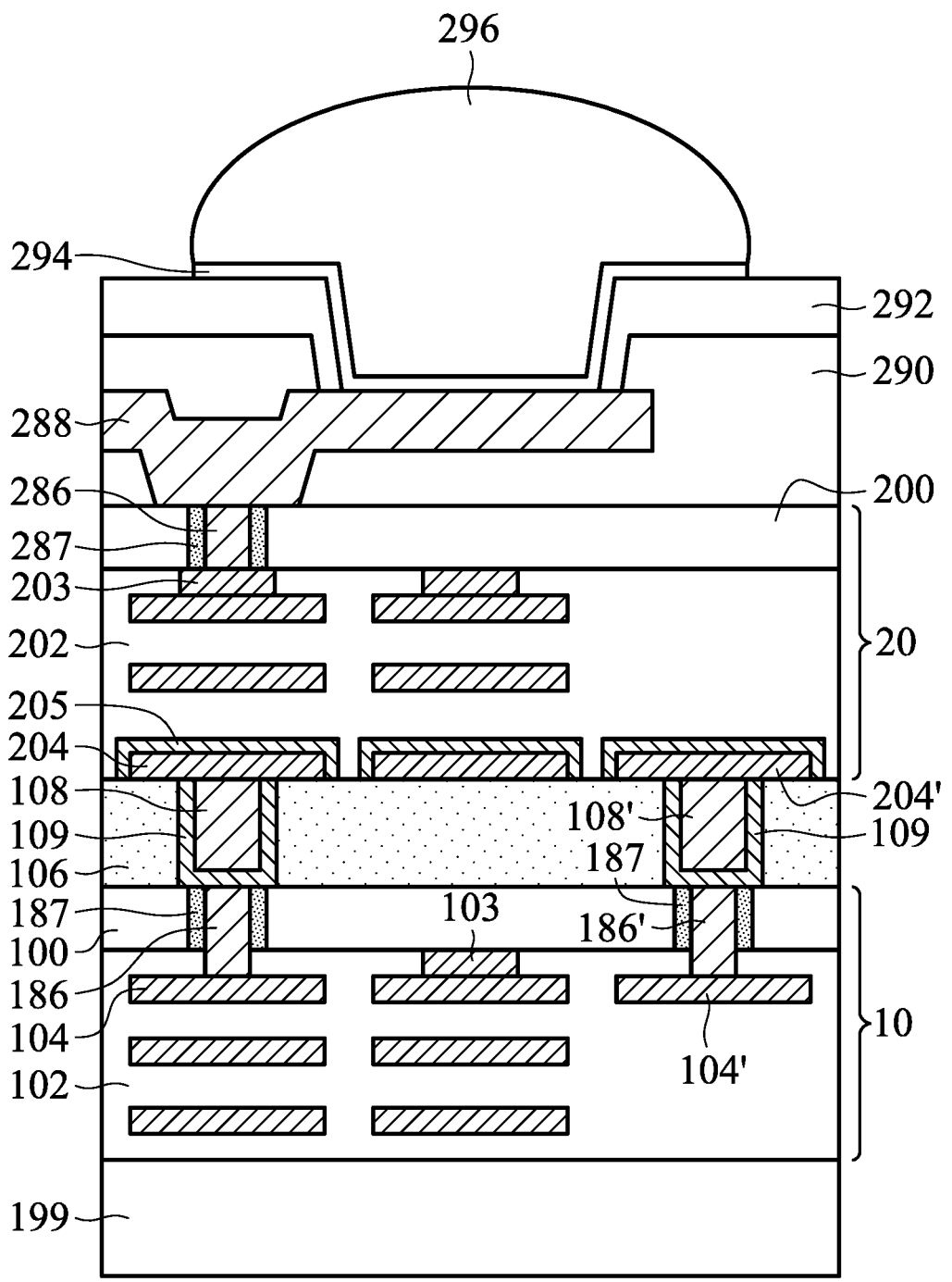
FIG. 3 is a cross-sectional view of a semiconductor device structure, in accordance with some embodiments.

FIG. 3 is a cross-sectional view of a semiconductor device structure, in accordance with some embodiments. In some embodiments, a passivation layer 199 is formed on the interconnection structure of the substrate 10. Afterwards, the substrate 10 is placed upside down. One or more through-substrate vias 186 and one or more dummy through-substrate vias 186' are formed in the semiconductor substrate 100 of the substrate 10. In FIG. 3, only one of the through-substrate vias 186 and one of the dummy through-substrate vias 186' are shown. Insulating layers 187 are formed between the semiconductor substrate 100 and the through-substrate vias 186 (or the dummy through-substrate vias 186'). In some embodiments, the materials and formation methods of the through-substrate vias 186, the dummy through-substrate vias 186', and the insulating layers 187 are similar to those of the through-substrate vias 286 and the insulating layers 287.

Afterwards, the passivation layer 106 is formed on the semiconductor substrate 100, as shown in FIG. 3 in accordance with some embodiments. In some embodiments, the passivation layer 106 is formed directly on the semiconductor substrate 100. The barrier layers 109, the conductive features 108, and the dummy features 108' are then formed, similar to the embodiments illustrated in FIG. 1B. Afterwards, processes similar to those illustrated in FIGS. 1C-1E are performed to form the structure shown in FIG. 3. In the embodiments illustrated in FIG. 3, the substrates 10 and 20 are stacked in a "face-to-back" manner.

In some embodiments, one of the conductive features 108 is in direct contact with and directly bonded to one of the conductive lines 204, as shown in FIG. 3. However, many variations and/or modifications can be made to embodiments of the disclosure. In some other embodiments, similar to the embodiments illustrated in FIGS. 2A-2B, the passivation layer and the conductive feature are formed on the substrate 20 before the bonding process. In these cases, one or some of the conductive features in the passivation layer are in direct contact with and directly bonded to one or some of the through-substrate vias 186 formed in the semiconductor substrate 100. In some embodiments, each of the conductive features is electrically connected to one of the through-substrate vias 186.

Many variations and/or modifications can be made to embodiments of the disclosure. In some embodiments, the substrates (or the semiconductor wafers) are stacked in a "back-to-face" manner.

Figure 4:
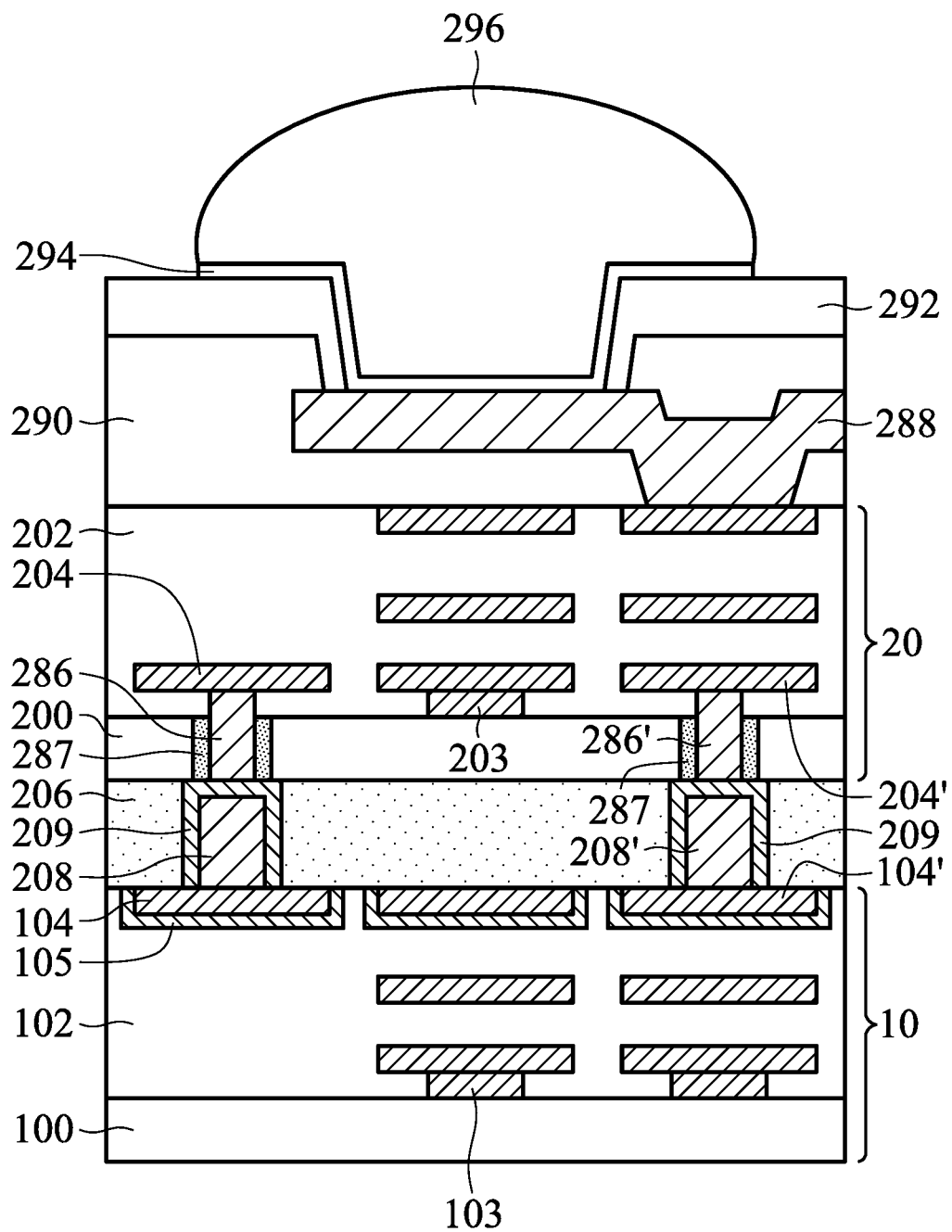
FIG. 4 is a cross-sectional view of a semiconductor device structure, in accordance with some embodiments.

FIG. 4 is a cross-sectional view of a semiconductor device structure, in accordance with some embodiments. In some embodiments, the passivation layer 206, the barrier layer 209, the conductive features 208, and the dummy features 208' are formed on the semiconductor substrate 200 of the substrate 20. In some embodiments, the insulating layer 287, the through-substrate vias 286 and dummy through-substrate vias 286' are formed before the formation of the passivation layer 206. Afterwards, similar to the embodiments illustrated in FIGS. 2A-2B, the substrate 20 is placed upside down and bonded onto the substrate 10, as shown in FIG. 4 in accordance with some embodiments. Afterwards, the first passivation layer 290, the redistribution layer 288, the second passivation layer 292, the UBM layer 294, and the conductive bump 296 are formed over the interconnection structure of the substrate 20, as shown in FIG. 4 in accordance with some embodiments.

Figure 5:
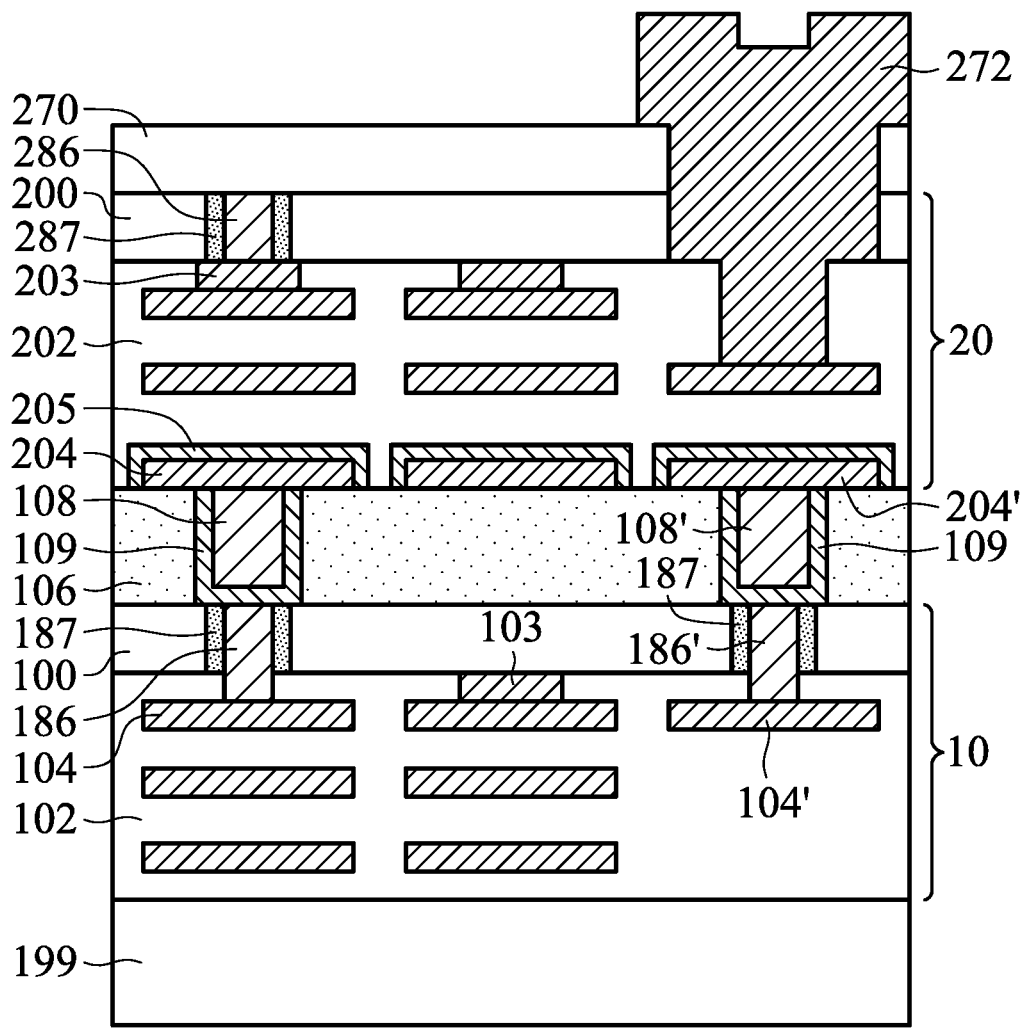
FIG. 5 is a cross-sectional view of a semiconductor device structure, in accordance with some embodiments.

Many variations and/or modifications can be made to embodiments of the disclosure. The conductive bump may be replaced with the pad structure. FIG. 5 is a cross-sectional view of a semiconductor device structure, in accordance with some embodiments. In some embodiments, a structure similar to that shown in FIG. 3 is provided. However, the conductive bump is not formed. In some embodiments, the passivation layer 270 and the pad structure 272 are formed, as shown in FIG. 5.

Figure 6:
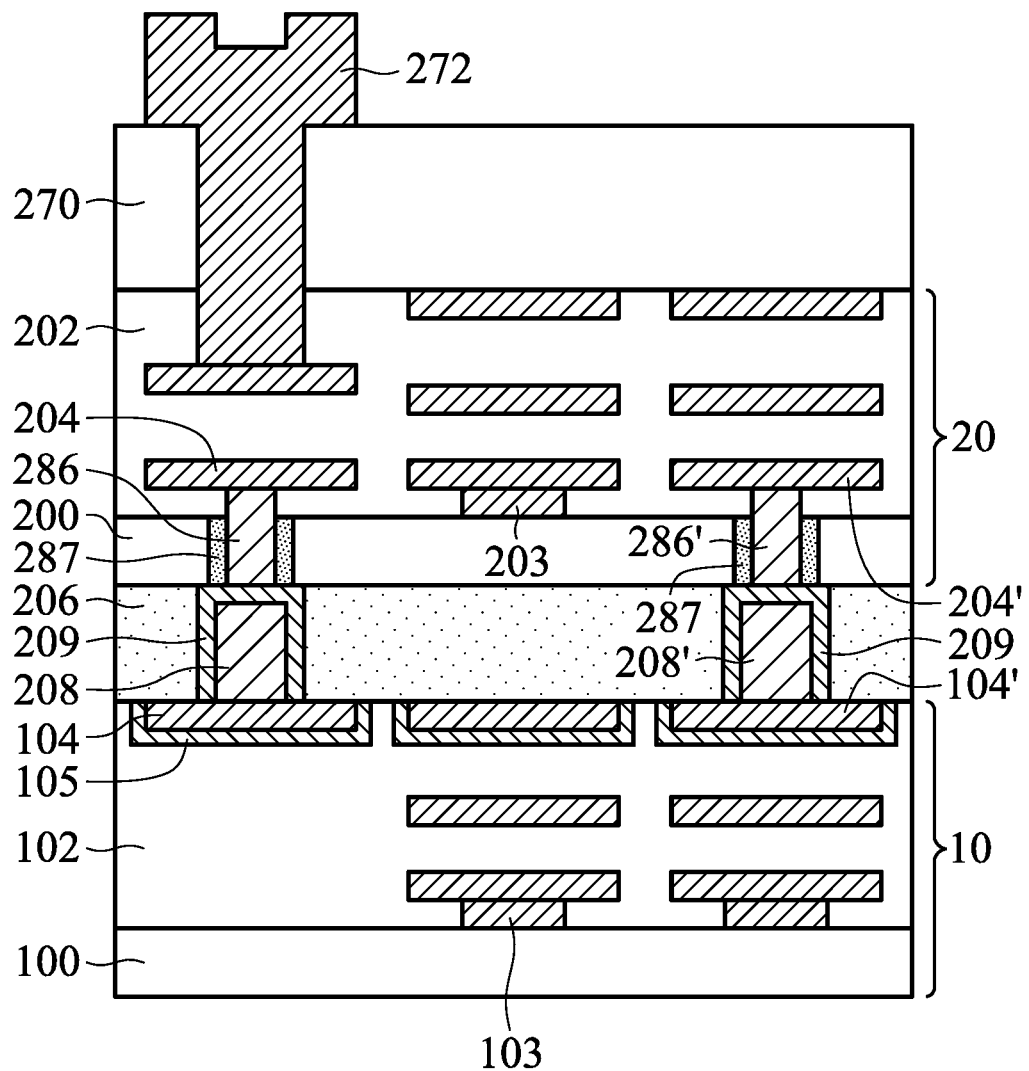
FIG. 6 is a cross-sectional view of a semiconductor device structure, in accordance with some embodiments.

FIG. 6 is cross-sectional view of a semiconductor device structure, in accordance with some embodiments. A structure similar to that shown in FIG. 4 is provided. However, the conductive bump is not formed. As shown in FIG. 6, the passivation layer 270 and the pad structure 272 are formed, in accordance with some embodiments.

Many variations and/or modifications can be made to embodiments of the disclosure. In some embodiments, more than two semiconductor wafers or semiconductor dies are stacked.

Figure 7:
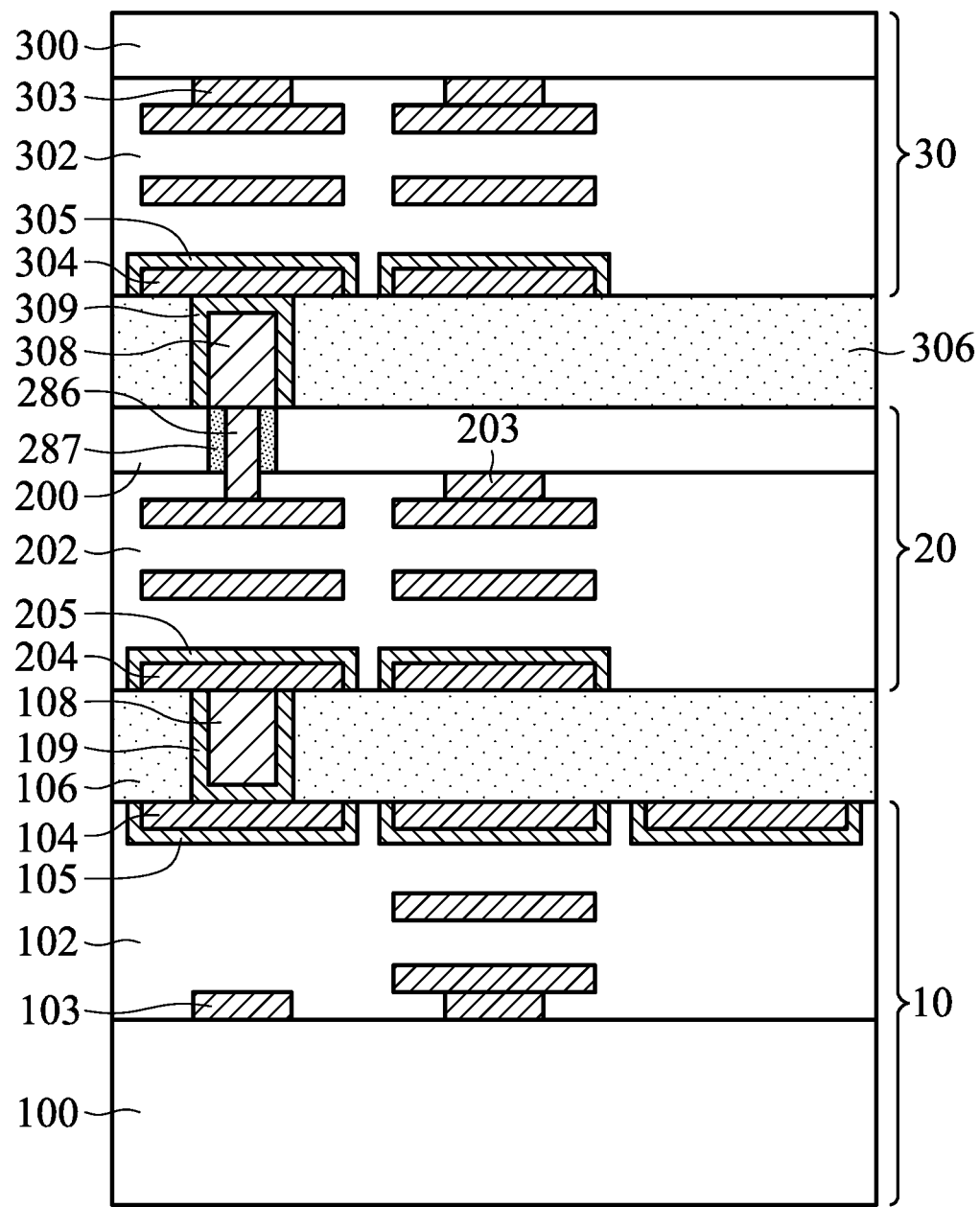
FIG. 7 is a cross-sectional view of a semiconductor device structure, in accordance with some embodiments.

FIG. 7 is a cross-sectional view of a semiconductor device structure, in accordance with some embodiments. A structure similar to that shown in FIG. 1D is provided. Afterwards, one or more through-substrate vias 286 are formed in the semiconductor substrate 200. In FIG. 7, only one of the through-substrate vias 286 is shown. In some embodiments, the insulating layer 287 is formed to electrically isolate the through-substrate vias 286 from the semiconductor substrate 200. In some embodiments, one of the through-substrate vias 286 extends into the interlayer dielectric layer 202 and is electrically connected to one of the conductive lines 204.

Afterwards, a substrate 30 is provided to be bonded over the substrate 20, as shown in FIG. 7 in accordance with some embodiments. In some embodiments, the substrate 30 includes a semiconductor wafer, a portion of a semiconductor wafer, or a semiconductor die. The semiconductor wafer (such as a silicon wafer) may contain device elements such active devices and/or passive devices.

In some embodiments, the substrate 30 includes a semiconductor substrate 300 and an interconnection structure formed on the semiconductor substrate 300, as shown in FIG. 7. The interconnection structures of the substrates 10 and 30 may be similar. The interconnection structure includes an interlayer dielectric layer 302 and multiple conductive features including conductive lines 304, conductive vias (not shown), and conductive contacts 303. Multiple conductive features such as contacts (such as conductive contacts 303), conductive vias (not shown), and conductive lines (such as the conductive lines 304) are formed in the interlayer dielectric layer 202. In some embodiments, barrier layers (such as barrier layers 305) are formed between the conductive features and the interlayer dielectric layer 302. In some embodiments, various device elements are formed in the semiconductor substrate 300. The device elements are interconnected through the interconnection structure over the semiconductor substrate 300 to form integrated circuit devices.

As shown in FIG. 7, a passivation layer 306 and one or more conductive features 308 are formed on the substrate 30, in accordance with some embodiments. In FIG. 7, only one of the conductive features 308 is shown. In some embodiments, barrier layers 309 are formed between the passivation layer 306 and the conductive features 308. In FIG. 7, only one of the barrier layers 309 is shown. In some embodiments, the materials and formation methods of the passivation layer 306, the conductive features 308, and the barrier layers 309 are similar to those of the passivation layer 106, the conductive features 108, and the barrier layers 109. Similar to that shown in FIG. 1C, the substrate 30 is then flipped to be bonded onto the substrate 20. In some embodiments, each of the substrates 10, 20, and 30 are semiconductor wafers, and FIG. 7 merely shows portions of the semiconductor wafers.

Similar to that shown in FIG. 1D, the substrate 30 is bonded onto the substrate 20 through the passivation layer 306 and the conductive features 308, as shown in FIG. 7 in accordance with some embodiments. In some embodiments, one of the conductive features 308 is in direct contact with and directly bonded to the corresponding one of the through-substrate vias 286 formed in the semiconductor substrate 200, as shown in FIG. 7.

In the embodiments illustrated in FIG. 7, the passivation layer 306 and the conductive features 308 are formed on the substrate 30 before the bonding between the substrates 30 and 20. However, embodiments of the disclosure are not limited thereto. In some other embodiments, a passivation layer and conductive features formed therein are formed on the semiconductor substrate 200 and the through-substrate vias 286 before the substrate 30 is bonded onto the substrate 20. In these cases, the passivation layer 306 and the conductive features 308 are not formed. The passivation layer is in direct contact with the substrates 30 and 20.

Many variations and/or modifications can be made to embodiments of the disclosure. In some embodiments, the substrates 30 and 20 are stacked in a "back-to-back" manner.

Figure 8:
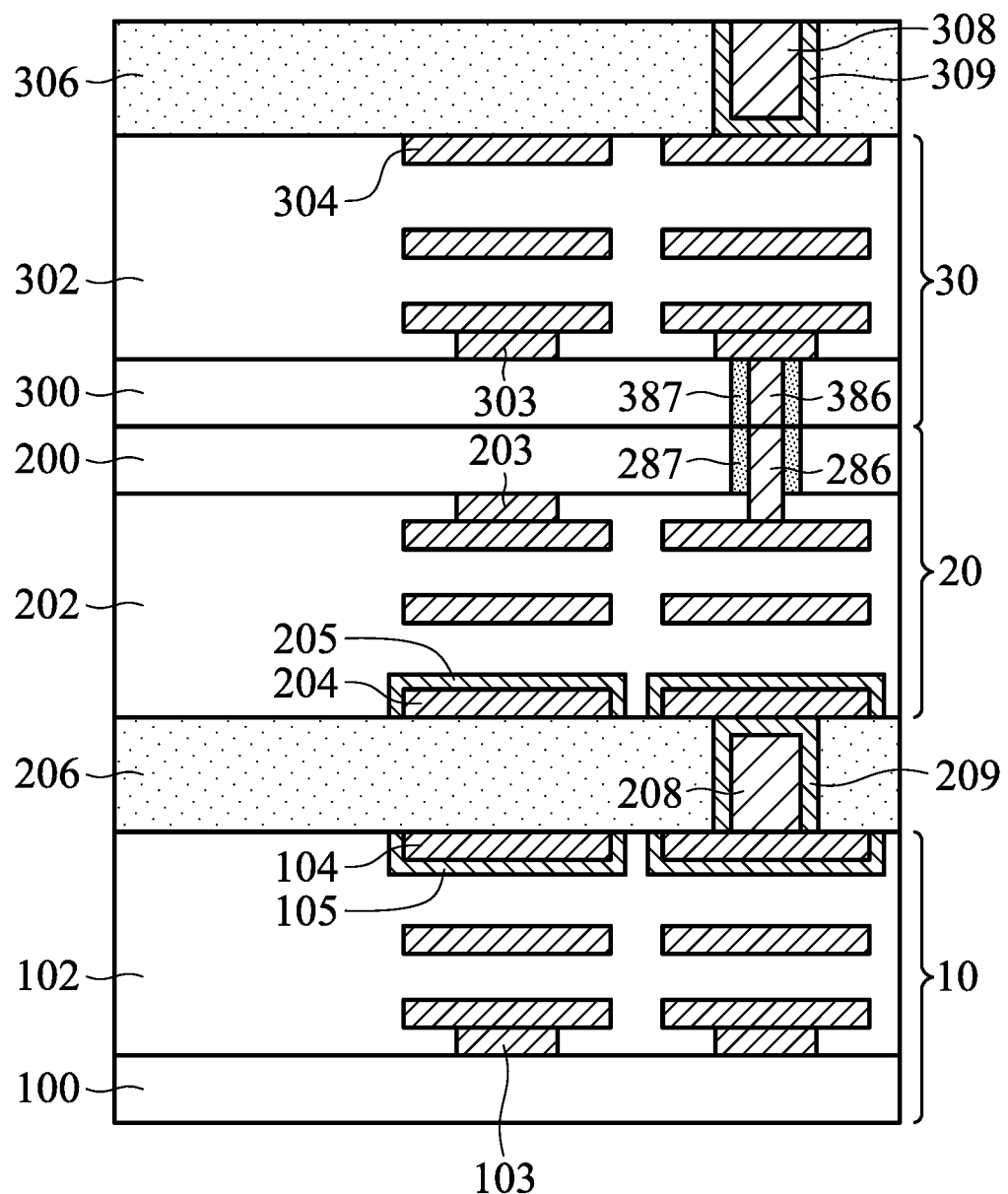
FIG. 8 is a cross-sectional view of a semiconductor device structure, in accordance with some embodiments.

FIG. 8 is a cross-sectional view of a semiconductor device structure, in accordance with some embodiments. A structure similar to that shown in FIG. 2B is provided. Afterwards, one or more through-substrate vias 286 are formed in the semiconductor substrate 200. In FIG. 8, only one of the through-substrate vias 286 is shown. In some embodiments, the insulating layer 287 is formed to electrically isolate the through-substrate vias 286 from the semiconductor substrate 200. In some embodiments, one of the through-substrate vias 286 extends into the interlayer dielectric layer 202 and is electrically connected to one of the conductive lines 204.

Afterwards, the substrate 30 is provided to be bonded over the substrate 20, as shown in FIG. 8. In some embodiments, one or more through-substrate vias 386 are formed in the semiconductor substrate 300. In FIG. 8, only one of the through-substrate vias 386 is shown. In some embodiments, the insulating layer 387 is formed to electrically isolate the through-substrate vias 386 from the semiconductor substrate 300. In some embodiments, one of the through-substrate vias 386 extends into the interlayer dielectric layer 202 and is electrically connected to one of the conductive contacts 303.

In some embodiments, the substrate 30 is bonded onto the substrate 20. In some embodiments, each of the substrates 10, 20, and 30 are semiconductor wafers, and FIG. 8 merely shows portions of the semiconductor wafers. In some embodiments, the substrate 30 is bonded onto the substrate 20 through the bonding between the semiconductor substrates 300 and 200 and the through-substrate vias 386 and 286, as shown in FIG. 8 in accordance with some embodiments. In some embodiments, one of the through-substrate vias 386 is directly bonded to one of the through-substrate vias 286.

As shown in FIG. 8, the passivation layer 306 and the conductive features 308 are formed on the substrate 30, in accordance with some embodiments. In FIG. 8, only one of the conductive features 308 is shown. In some embodiments, the barrier layers 309 are formed between the passivation layer 306 and the conductive features 308. Another substrate (such as a semiconductor wafer) may be stacked on the passivation layer 306 and the conductive features 308.

Figure 9:
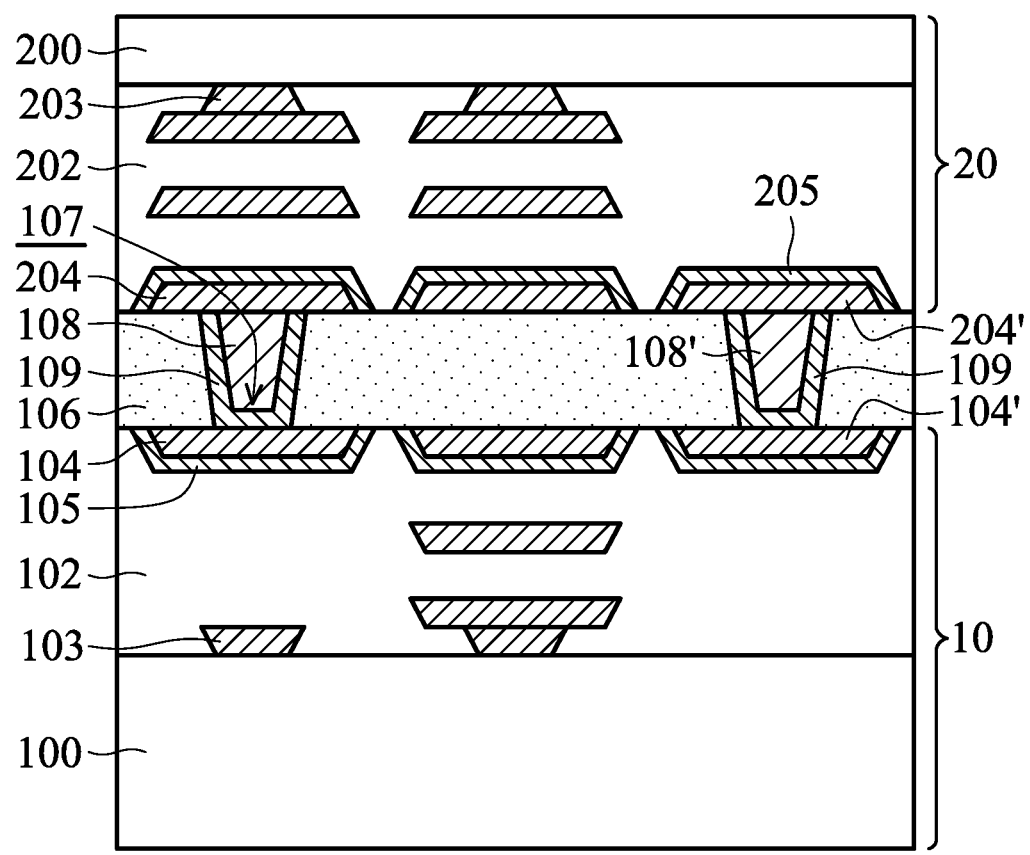
FIG. 9 is a cross-sectional view of a semiconductor device structure, in accordance with some embodiments.

FIG. 9 is a cross-sectional view of a semiconductor device structure, in accordance with some embodiments. As shown in FIG. 9, a structure similar to that shown in FIG. 1D is provided. In some embodiments, the via holes 107 that contain the conductive features 108 or the dummy features 108' have slanted sidewalls. In some embodiments, each of the via holes 107 gradually becomes narrower along a direction extending from one of the conductive lines 204 towards the substrate 10. In some embodiments, the conductive features formed in the interlayer dielectric layers 102 and 202 also have slanted sidewalls. As shown in FIG. 9, the conductive lines 104 and the conductive contacts 103 have slanted sidewalls. The conductive lines 204 and the conductive contacts 203 also have slanted sidewalls.

Many variations and/or modifications can be made to embodiments of the disclosure. In some embodiments, one of the stacked substrate is a semiconductor wafer or a semiconductor die that contains image sensor devices. There are light sensing regions formed in one of the stacked substrates.

Figure 10A:
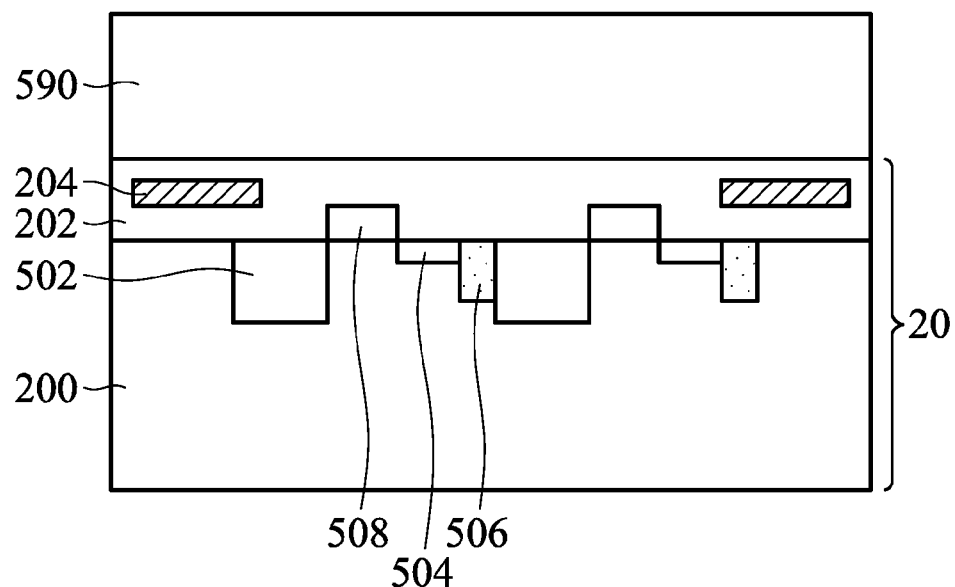
FIGS. 10A-10D are cross-sectional views of various stages of a process for forming a semiconductor device structure, in accordance with some embodiments.

FIGS. 10A-10D are cross-sectional views of various stages of a process for forming a semiconductor device structure, in accordance with some embodiments. As shown in FIG. 10A, the substrate 20 including the semiconductor substrate 200, the interlayer dielectric layer 202, and the conductive lines 204 are provided. In some embodiments, light sensing regions 502, doped regions 504, and isolation features 506 are formed in the semiconductor substrate 200. In some embodiments, gate stacked 508 are formed over the semiconductor substrate 200 and surrounded by the interlayer dielectric layer 202. In some embodiments, the doped regions 508 are referred as floating diffusion regions, and the gate stacks 508 are used as gates of transfer transistors.

In some embodiments, a carrier substrate 590 is bonded onto the substrate 20. In some embodiments, the carrier substrate 590 is a semiconductor substrate, a semiconductor wafer, a glass wafer, a ceramic substrate, another suitable substrate, or a combination thereof. In some embodiments, the carrier substrate 590 is a semiconductor substrate, and a dielectric film is formed on a surface of the carrier substrate 590 before bonding with the substrate 20. The dielectric film may facilitate bonding between the carrier substrate 590 and the substrate 20. In some embodiments, the dielectric film is formed using a CVD process, a thermal oxidation process, a spin-on process, another applicable process, or a combination thereof.

Figure 10B:
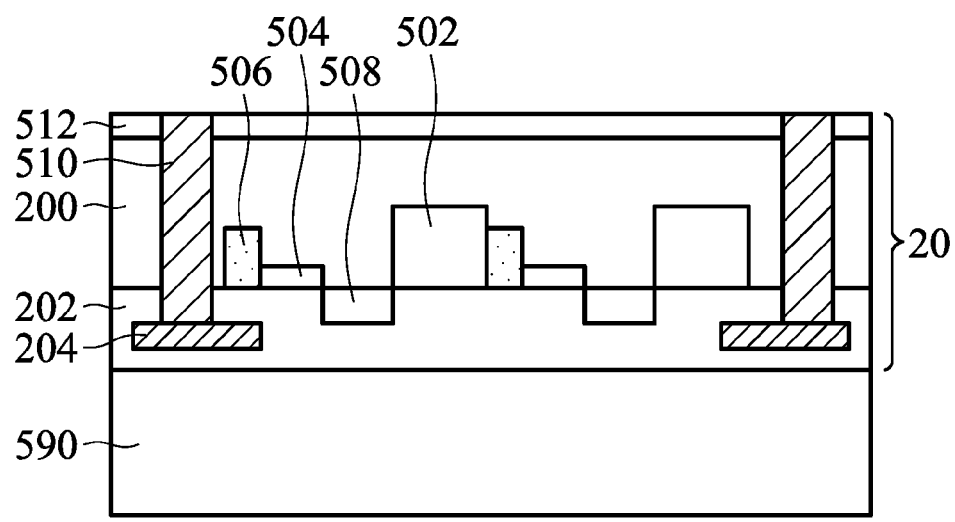

As shown in FIG. 10B, the structure shown in FIG. 10A is placed upside down, and the semiconductor substrate 200 is thinned, in accordance with some embodiments. Afterwards, through-substrate vias 510 are formed in the semiconductor substrate 200. Each of the through-substrate vias 510 penetrates through the semiconductor substrate 200 and is electrically connected to one of the conductive lines 204 in the interlayer dielectric layer 202. In some embodiments, a protection layer 512 is formed over the semiconductor substrate 200 to surround protruding portions of the through-substrate vias 510. In some embodiments, insulating elements (not shown) are formed between the through-substrate vias 510 and the semiconductor substrate 200.

Figure 10C:
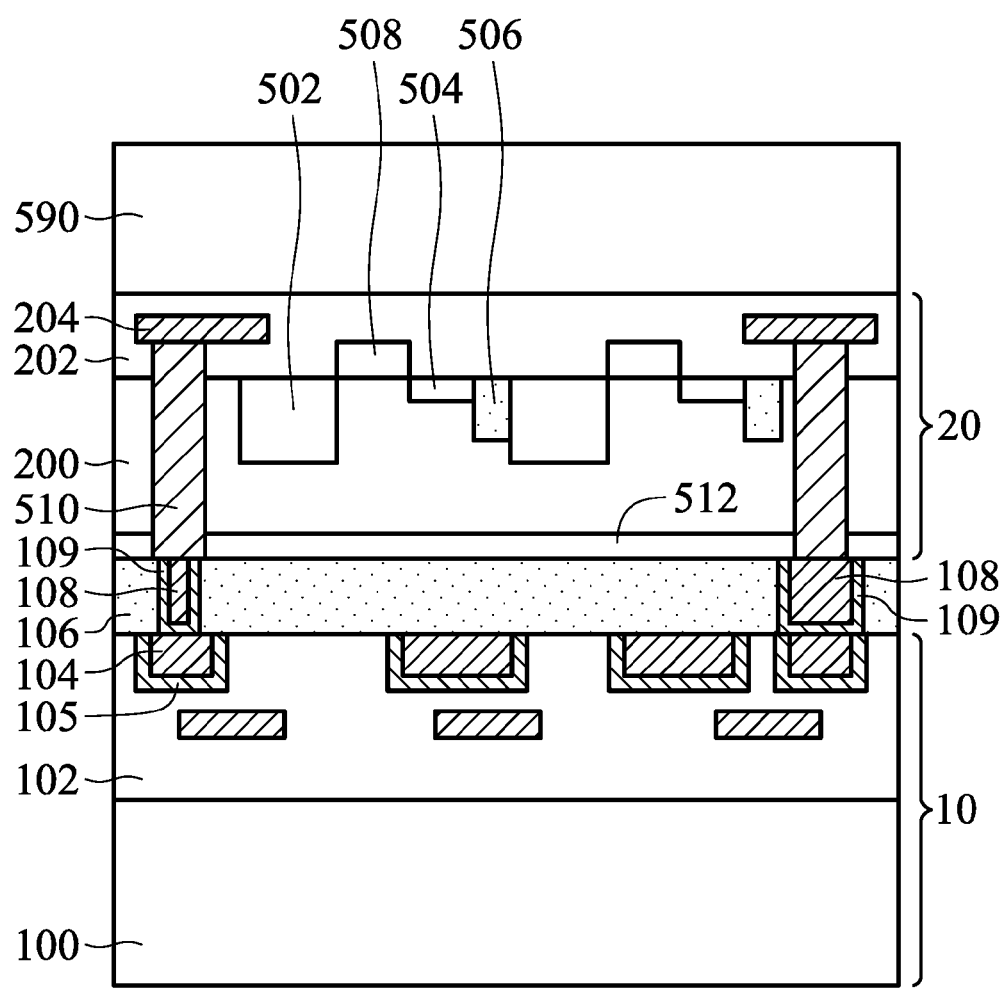

As shown in FIG. 10C, the structure shown in FIG. 10B is placed upside down and bonded to a structure similar to that shown in FIG. 1B, in accordance with some embodiments. Similar to the embodiments mentioned above, the bonding is achieved using a hybrid bonding. In some embodiments, each of the through-substrate vias 510 is directly bonded to one of the conductive features 108 formed in the passivation layer 106. In some embodiments, one of the through-substrate vias 510 is wider than the corresponding one of the conductive features 108. In some embodiments, one of the through-substrate vias 510 is narrower than the corresponding one of the conductive features 108.

Figure 10D:
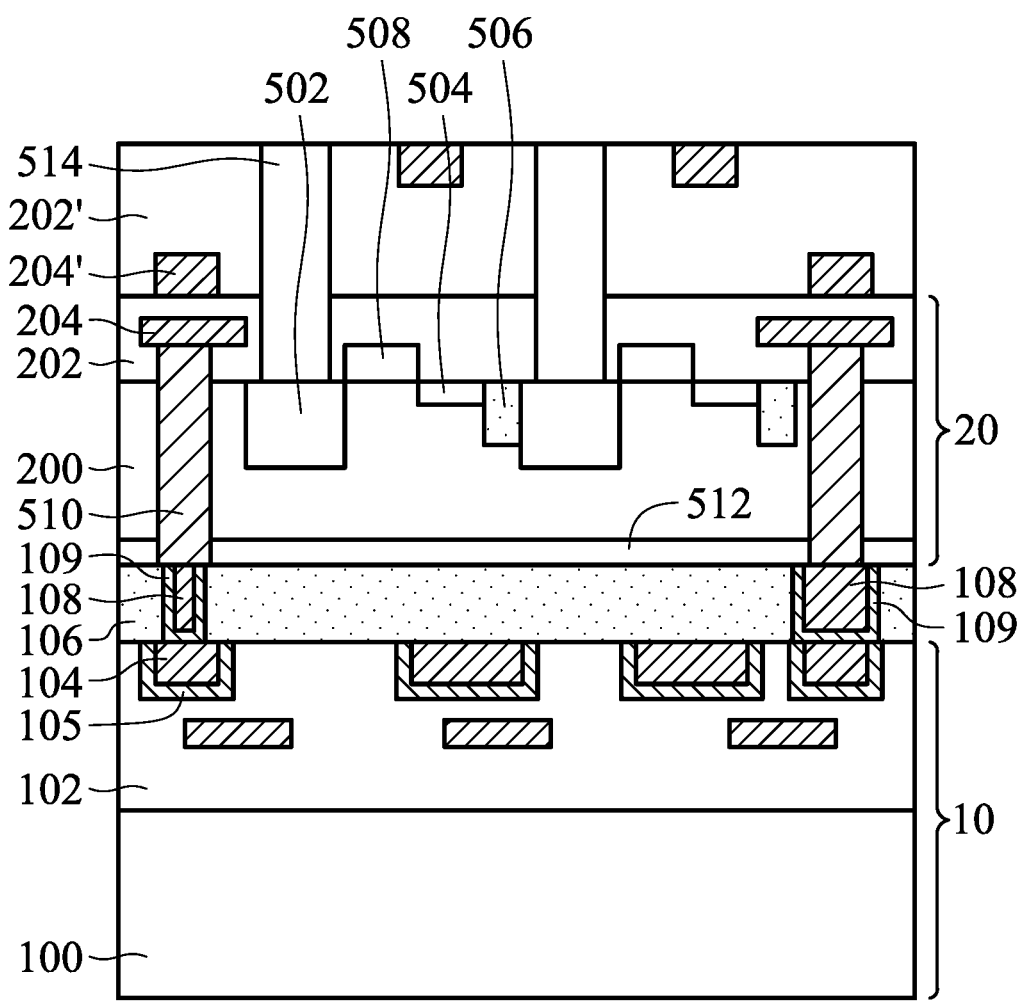

As shown in FIG. 10D, the carrier substrate 590 is removed from the substrate 20, in accordance with some embodiments. In some embodiments, another interlayer dielectric layer 202' and conductive features including conductive lines 204' are formed on the substrate 20. In some embodiments, openings are formed in the interlayer dielectric layers 202 and 202' to expose the light sensing regions 502. Afterwards, a transparent material is formed in the openings to form light pipes 514, as shown in FIG. 10D in accordance with some embodiments. The light pipes 514 may be used to guide light to the light sensing regions 502. In some embodiments, multiple optical elements (not shown), such as color filters and lens, are formed over the light pipes 514. The structure shown in FIG. 10D may be used as a front-side illuminated (FSI) image sensor.

Figure 11:
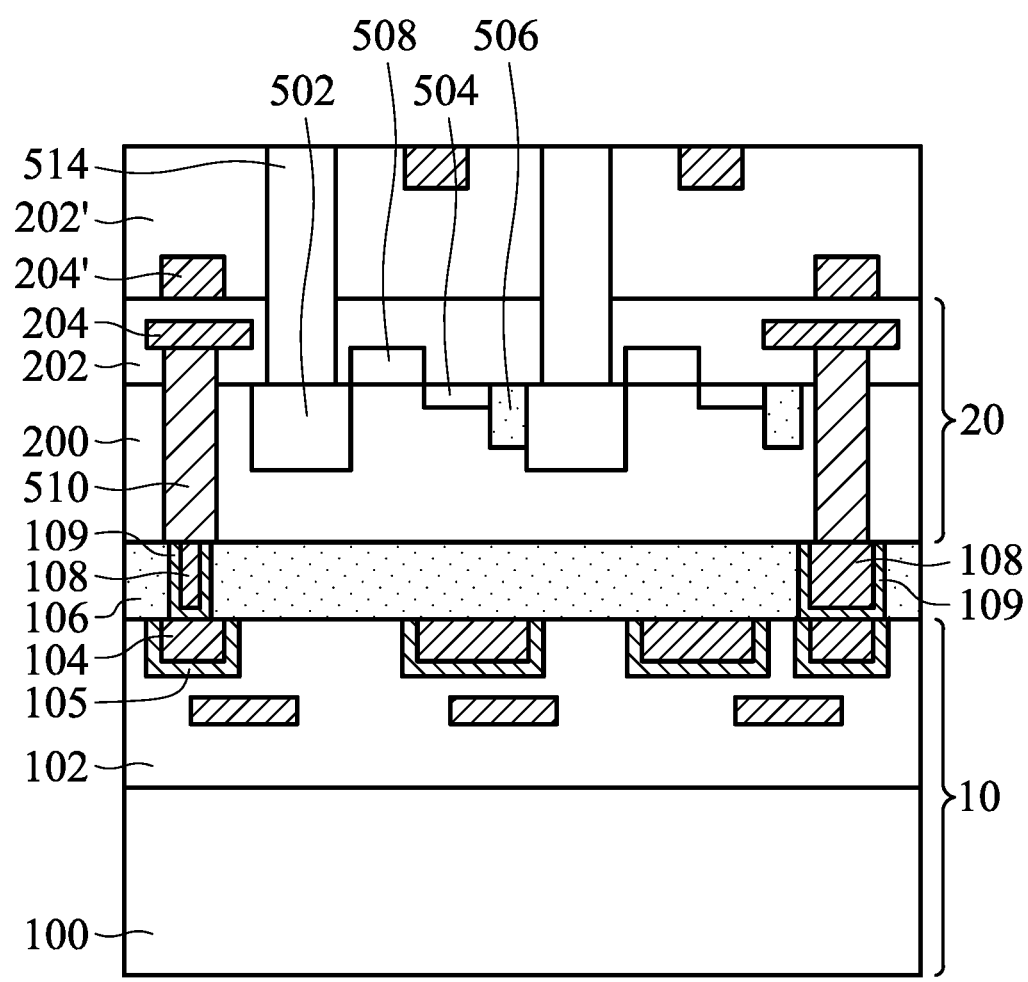
FIG. 11 is a cross-sectional view of a semiconductor device structure, in accordance with some embodiments.

FIG. 11 is a cross-sectional view of a semiconductor device structure, in accordance with some embodiments. In some embodiments, the protection layer 512 is not formed, as shown in FIG. 11. In some embodiments, the surfaces of the through-substrate vias 510 are substantially coplanar with the surface of the semiconductor substrate 200. In some embodiments, the passivation layer 106 is directly bonded to the semiconductor substrate 200, as shown in FIG. 11.

Many variations and/or modifications can be made to embodiments of the disclosure. For example, the passivation layer and the conductive features are formed on the substrate 20 before bonding with the substrate 10.

Figure 12:
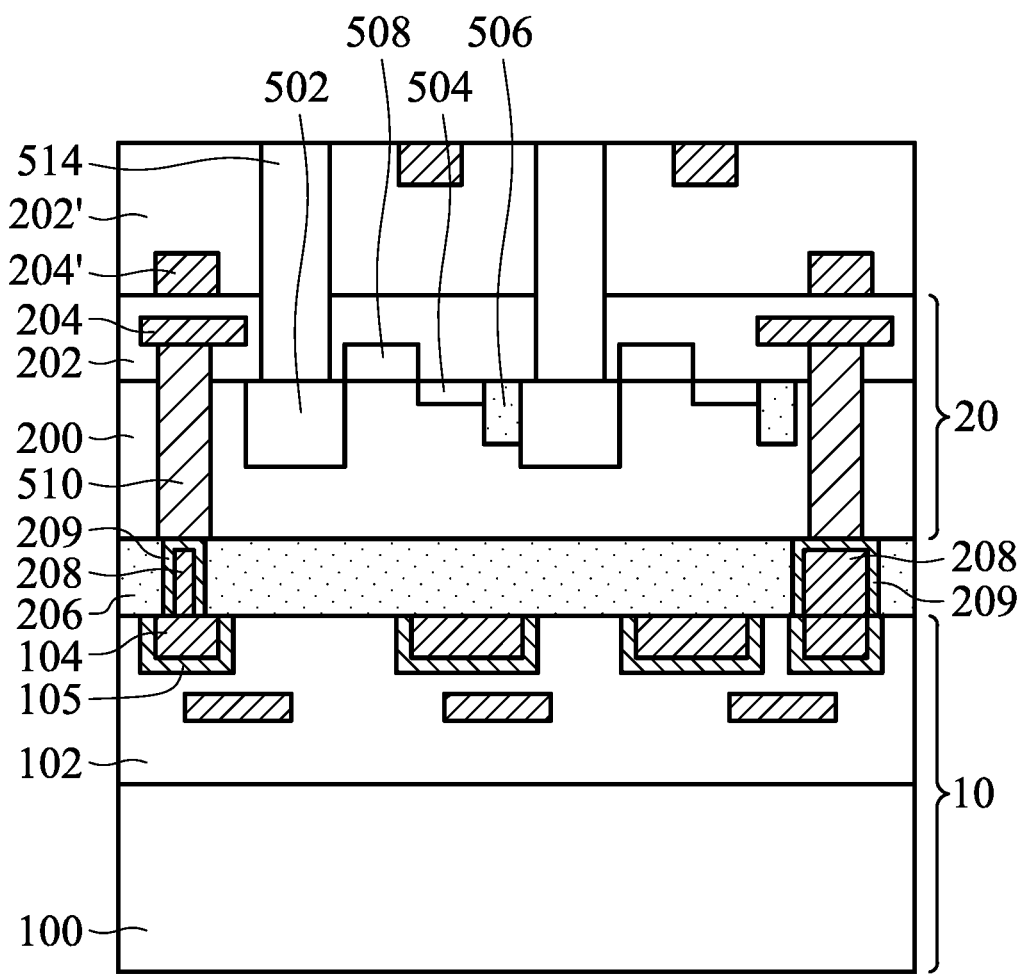
FIG. 12 is a cross-sectional view of a semiconductor device structure, in accordance with some embodiments.

FIG. 12 is a cross-sectional view of a semiconductor device structure, in accordance with some embodiments. In some embodiments, similar to the embodiments shown in FIGS. 2A-2B, the passivation layer 206, the conductive features 208, and the barrier layer 209 are formed on the substrate 20 before bonding with the substrate 10. Afterwards, similar to the embodiments shown in FIGS. 2A-2B, the bonding between the substrates 10 and 20 is achieved using a hybrid bonding. In some embodiments, the passivation layer 206 is directly bonded to the interlayer dielectric layer 102. In some embodiments, each of the conductive features 208 is directly bonded to one of the conductive lines 104.

Many variations and/or modifications can be made to embodiments of the disclosure. For example, embodiments of the disclosure may include back-side illuminated (BSI) image sensor.

Figure 13A:
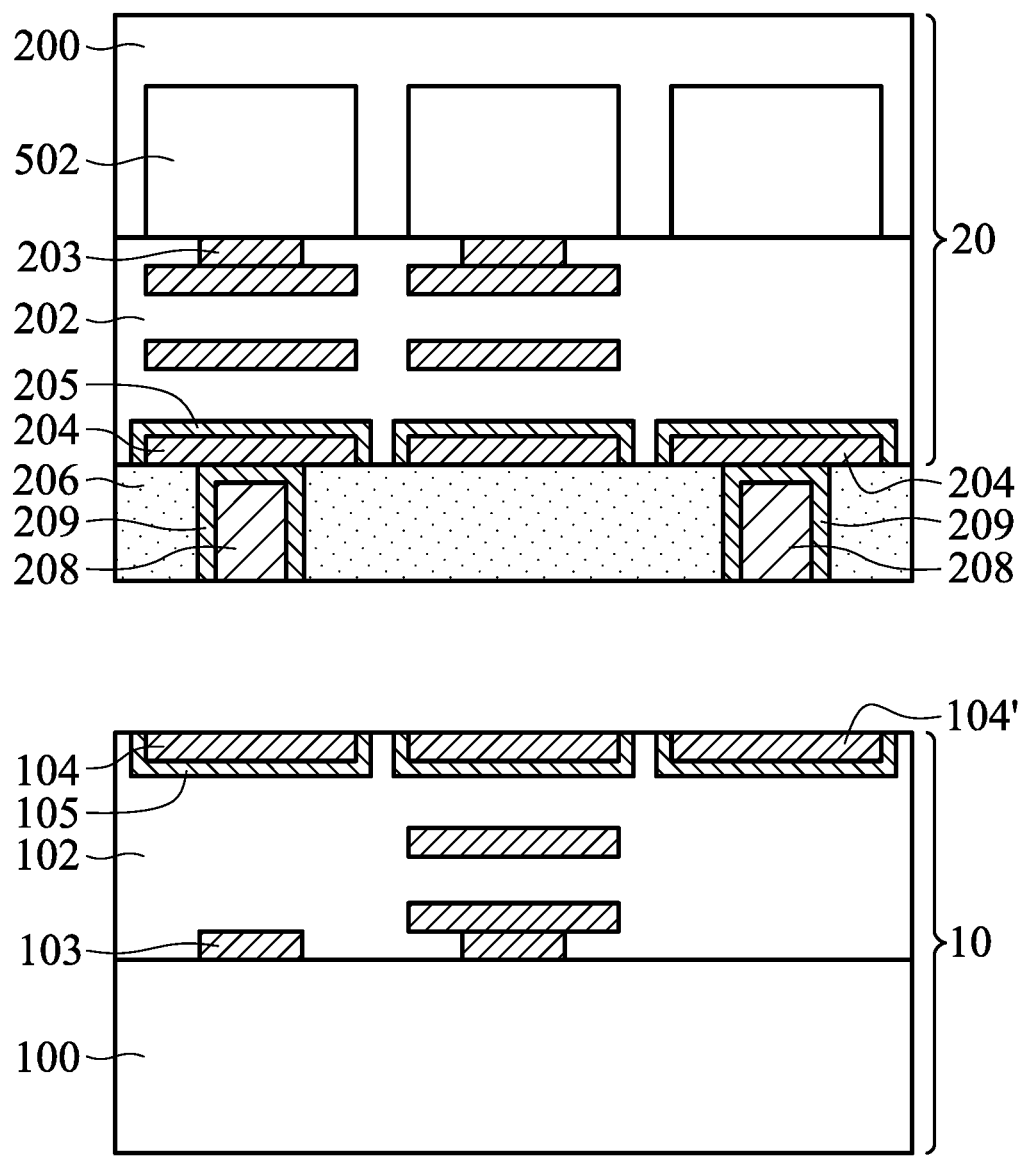
FIGS. 13A-13C are cross-sectional views of various stages of a process for forming a semiconductor device structure, in accordance with some embodiments.
Figure 13B:
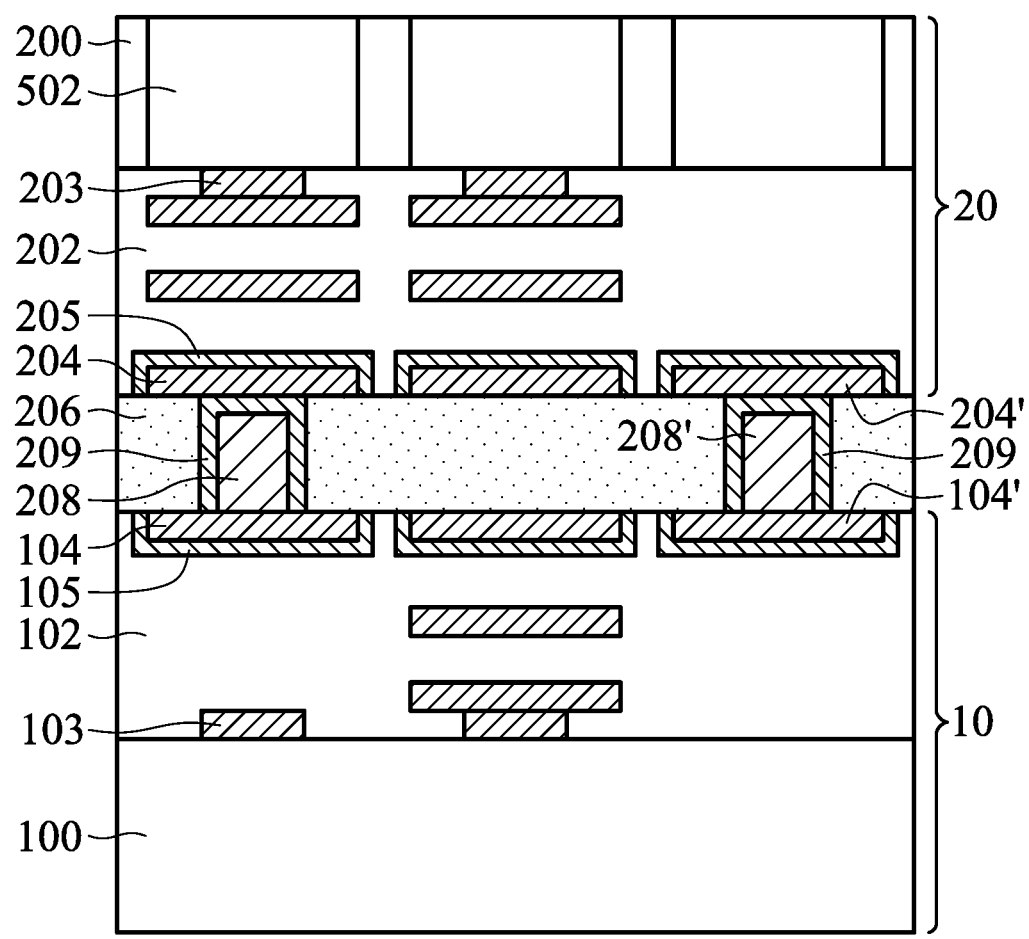
Figure 13C:
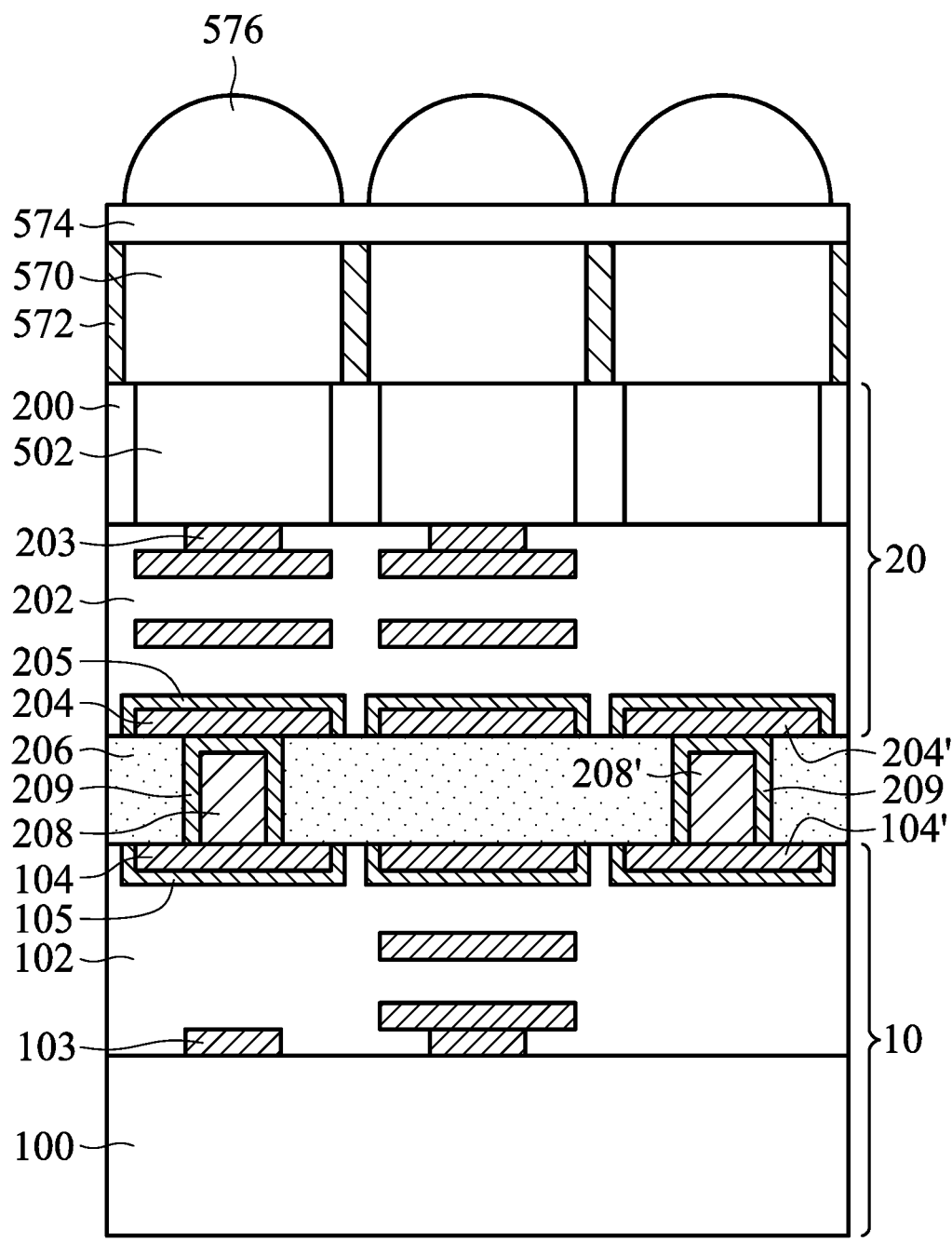

FIGS. 13A-13C are cross-sectional views of various stages of a process for forming a semiconductor device structure, in accordance with some embodiments. As shown in FIG. 13A, the substrate 20 including the light sensing regions 502 formed in the semiconductor substrate 200 is provided. In some embodiments, the passivation layer 206, the conductive features 208, and the barrier layers 209 are formed on the interconnection structure of the substrate 20. As shown in FIG. 13A, the substrate 10 is provided. In some embodiments, the substrate 10 is an application specific integrated circuit (ASIC) wafer.

As shown in FIG. 13B, similar to the embodiments shown in FIGS. 2A-2B, the substrates 20 and 10 are bonded using a hybrid bonding. In some embodiments, the passivation layer 206 is directly bonded to the interlayer dielectric layer 102. In some embodiments, each of the conductive features 208 is directly bonded to one of the conductive lines 104. In some embodiments, after the bonding process, the semiconductor substrate 200 is thinned. In some embodiments, the semiconductor substrate 200 is thinned until the light sensing regions 502 are exposed or almost exposed. In some embodiments, doped regions and/or a negatively-charged film are formed on the light sensing regions 502 to repair defects formed during the thinning of the semiconductor substrate 200.

As shown in FIG. 13C, optical elements are then formed on the light sensing regions 502 to guide light into the light sensing regions 502, in accordance with some embodiments. In some embodiments, a reflective grid 572 and a dielectric layer 570 are formed over the semiconductor substrate 200. The reflective grid 572 may be metal grid that is used to reflect light into the light sensing regions 502. In some embodiments, a color filter film 574 and microlenses 576 are formed over the light sensing regions 502.

Many variations and/or modifications can be made to embodiments of the disclosure. For example, the passivation layer and the conductive features are formed on the substrate 10 before bonding with the substrate 20.

Figure 14:
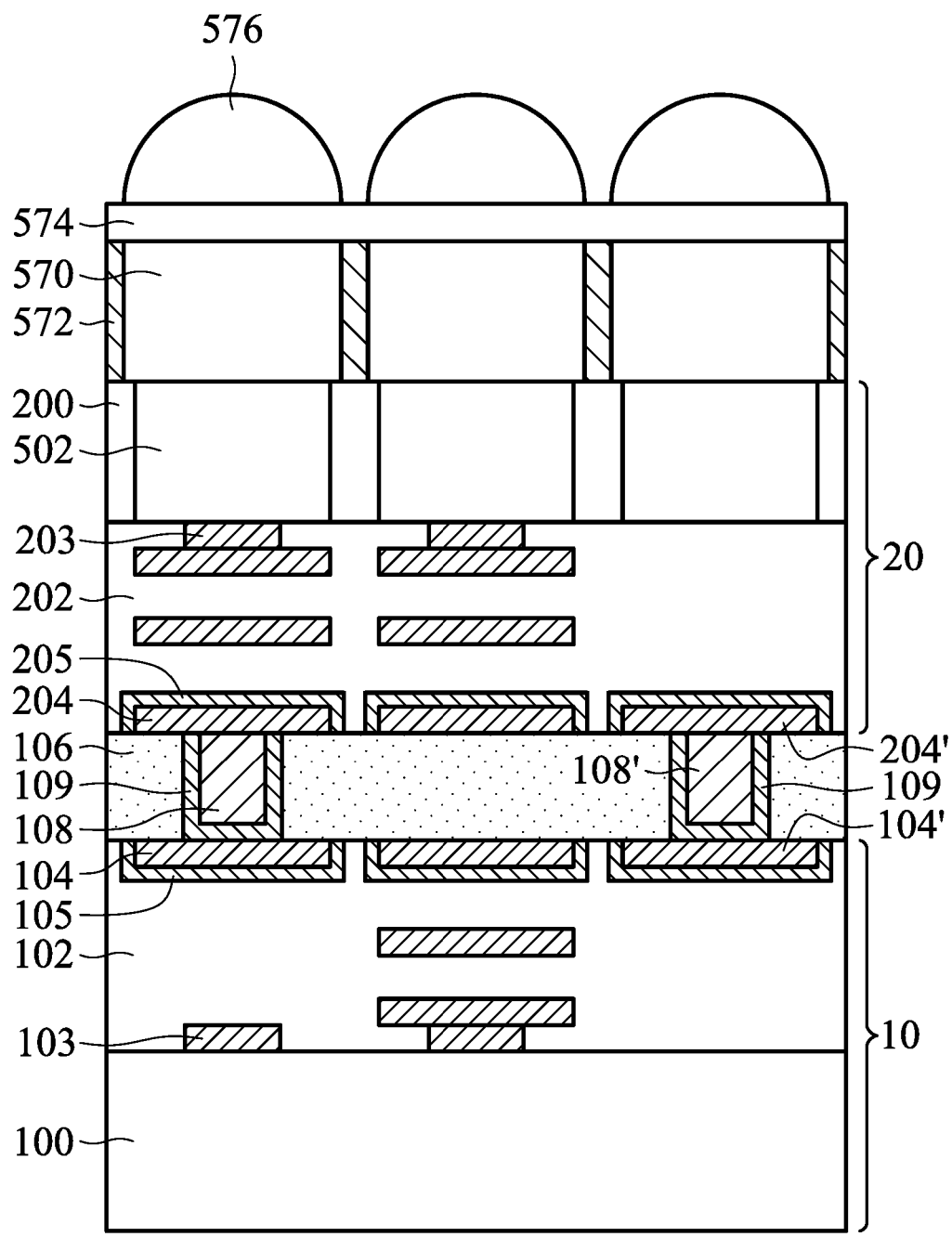
FIG. 14 is a cross-sectional view of a semiconductor device structure, in accordance with some embodiments.

FIG. 14 is a cross-sectional view of a semiconductor device structure, in accordance with some embodiments. In some embodiments, similar to the embodiments shown in FIGS. 1B-1D, the passivation layer 106, the conductive features 108, and the barrier layer 109 are formed on the substrate 10 before bonding with the substrate 20. Afterwards, similar to the embodiments shown in FIGS. 1C-1D, the bonding between the substrates 10 and 20 is achieved using a hybrid bonding. In some embodiments, the passivation layer 106 is directly bonded to the interlayer dielectric layer 202. In some embodiments, each of the conductive features 108 is directly bonded to one of the conductive lines 204.

Embodiments of the disclosure use a passivation layer and conductive features formed in the passivation layer to achieve the bonding between two semiconductor substrates (or semiconductor wafers). The conductive features are used to assist in the bonding process and provide electrical connections between device elements formed in the semiconductor substrates (or semiconductor wafers). The formation of the conductive features involves only a single patterning process that is used for forming via holes containing the conductive features. The number of patterning processes is reduced. Therefore, the fabrication cost and time are significantly reduced.

In accordance with some embodiments, a semiconductor device structure is provided. The semiconductor device structure includes a first semiconductor die having a first interlayer dielectric layer and a first conductive line formed in the first interlayer dielectric layer. The semiconductor device structure also includes a second semiconductor die having a second interlayer dielectric layer, a second conductive line formed in the second interlayer dielectric layer, and a first barrier layer between the second conductive line and the second interlayer dielectric layer. The semiconductor device structure further includes a passivation layer between the first semiconductor die and the second semiconductor die, and the passivation layer is directly bonded to the second interlayer dielectric layer. In addition, the semiconductor device structure includes a via hole penetrating through the passivation layer and a conductive feature in via hole. The conductive feature is directly bonded to the second conductive line. The semiconductor device structure also includes a second barrier layer between the conductive feature and the passivation layer. The second barrier layer covers sidewalls of the conductive feature and a surface of the conductive feature closer to the first semiconductor die than the second semiconductor die.

In accordance with some embodiments, a semiconductor device structure is provided. The semiconductor device structure includes a first semiconductor die and a second semiconductor die bonded on the first semiconductor die. The semiconductor device structure also includes a second semiconductor die bonded on the first semiconductor die. The semiconductor device structure further includes a passivation layer between the first semiconductor die and the second semiconductor die, and the passivation layer is directly bonded to the semiconductor substrate of the second semiconductor die. In addition, the semiconductor device structure includes a via hole penetrating through the passivation layer and a conductive feature in via hole. The conductive feature is bonded to the through-substrate via.

In accordance with some embodiments, a semiconductor device structure is provided. The semiconductor device structure includes a first semiconductor die having a first interlayer dielectric layer, a first conductive line in the first interlayer dielectric layer, and a first barrier layer between the first interlayer dielectric layer and the first conductive line. The semiconductor device structure also includes a second semiconductor die stacked on the first semiconductor die having a second interlayer dielectric layer, a first conductive line in the first interlayer dielectric layer, and a second barrier layer between the second interlayer dielectric layer and the second conductive line. The semiconductor device structure further includes a third semiconductor die stacked on the second semiconductor die. In addition, the semiconductor device structure includes a passivation layer between the first semiconductor die and the second semiconductor die. The passivation layer is directly bonded to one of the first interlayer dielectric layer and the second interlayer dielectric layer. The semiconductor device structure also includes a via hole penetrating through the passivation layer and a conductive feature in the via hole. The conductive feature is directly bonded to one of the first conductive line and the second conductive line. The semiconductor device structure further includes a third barrier layer between the conductive feature and the passivation layer. The barrier layer covers sidewalls of the conductive feature and is in direct contact with one of the second conductive line and the first conductive line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
    a first semiconductor die having a first interlayer dielectric layer and a first conductive line formed in the first interlayer dielectric layer;
    a second semiconductor die having a second interlayer dielectric layer, a second conductive line formed in the second interlayer dielectric layer, and a first barrier layer between the second conductive line and the second interlayer dielectric layer;
    a passivation layer between the first semiconductor die and the second semiconductor die, wherein the passivation layer is directly bonded to the second interlayer dielectric layer;
    a via hole penetrating through the passivation layer;
    a conductive feature in via hole, wherein the conductive feature is directly bonded to the second conductive line;
    a second barrier layer between the conductive feature and the passivation layer, wherein the second barrier layer covers sidewalls of the conductive feature and a surface of the conductive feature closer to the first semiconductor die than the second semiconductor die; and
    a through-substrate via penetrating through a semiconductor substrate of the first semiconductor die, wherein the conductive feature is electrically connected to the through-substrate via.

2. The semiconductor device structure as claimed in claim 1, wherein surfaces of the first conductive line, the first interlayer dielectric layer, the second barrier layer, and the passivation layer are coplanar.

3. The semiconductor device structure as claimed in claim 1, wherein surfaces of the passivation layer, the conductive feature, the second barrier layer, the second interlayer dielectric layer, the second conductive line, and the first barrier layer are coplanar.

4. The semiconductor device structure as claimed in claim 1, wherein the second barrier layer is in direct contact with the second conductive line.

5. The semiconductor device structure as claimed in claim 1, wherein the conductive feature is wider than the through-substrate via.

6. The semiconductor device structure as claimed in claim 1, wherein the passivation layer is directly bonded to the first barrier layer.

7. The semiconductor device structure as claimed in claim 1, wherein the via hole gradually becomes narrower along a direction extending from the second conductive line towards the first semiconductor die.

8. A semiconductor device structure, comprising:
    a first semiconductor die;
    a second semiconductor die bonded on the first semiconductor die;
    a through-substrate via penetrating through a semiconductor substrate of the second semiconductor die;
    a passivation layer between the first semiconductor die and the second semiconductor die, wherein the passivation layer is directly bonded to the semiconductor substrate of the second semiconductor die;
    a via hole penetrating through the passivation layer;
    a conductive feature in via hole, wherein the conductive feature is bonded to the through-substrate via; and
    a barrier layer between the conductive feature and the passivation layer, wherein the barrier layer covers sidewalls of the conductive feature and covers a surface of the conductive feature nearest to the first semiconductor die and closer to the first semiconductor die than the second semiconductor die, the barrier layer separating the surface of the conductive feature from a nearest neighboring surface of the first semiconductor die.

9. The semiconductor device structure as claimed in claim 8, wherein surfaces of the passivation layer, the conductive feature, and the semiconductor substrate of the second semiconductor die are coplanar.

10. The semiconductor device structure as claimed in claim 8, wherein the conductive feature is wider than the through-substrate via.

11. The semiconductor device structure as claimed in claim 8, wherein the barrier layer is between the conductive feature and the through-substrate via.

12. The semiconductor device structure as claimed in claim 8, wherein the barrier layer is between the conductive feature and the first semiconductor die.

13. A semiconductor device structure, comprising:
    a first semiconductor die having a first interlayer dielectric layer, a first conductive line in the first interlayer dielectric layer, and a first barrier layer between the first interlayer dielectric layer and the first conductive line;
    a second semiconductor die stacked on the first semiconductor die having a second interlayer dielectric layer, a second conductive line in the second interlayer dielectric layer, and a second barrier layer between the second interlayer dielectric layer and the second conductive line;
    a third semiconductor die stacked on the second semiconductor die;

a passivation layer between the first semiconductor die and the second semiconductor die, wherein the passivation layer is directly bonded to one of the first interlayer dielectric layer and the second interlayer dielectric layer;

a via hole penetrating through the passivation layer;

a conductive feature in the via hole, wherein the conductive feature is directly bonded to the first conductive line; and a third barrier layer between the conductive feature and the passivation layer, wherein the third barrier layer covers sidewalls of the conductive feature and is in direct contact with one of the second conductive line and the first conductive line; wherein the third barrier layer covers a surface of the conductive feature not directly bonded to one of the first conductive line and the second conductive line, the third barrier layer separating the surface of the conductive feature from a nearest neighboring surface of the first semiconductor die or the second semiconductor die.

14. The semiconductor device structure as claimed in claim 13, further comprising a through-substrate via penetrating through a semiconductor substrate of the second semiconductor die.

15. The semiconductor device structure as claimed in claim 14, further comprising:

a second passivation layer between the second semiconductor die and the third semiconductor die, wherein the second passivation layer is directly bonded to one of the semiconductor substrate of the second semiconductor die and a semiconductor substrate of the third semiconductor die;

a second via hole penetrating through the second passivation layer; and a second conductive feature in the second via hole, wherein the second conductive feature is electrically connected to the through-substrate via.

16. The semiconductor device structure as claimed in claim 15, wherein the second conductive feature is directly bonded to the through-substrate via.

17. The semiconductor device structure as claimed in claim 14, further comprising a second through-substrate via penetrating through a semiconductor substrate of the third semiconductor die, wherein the second through-substrate via is directly bonded to the through-substrate via penetrating through the semiconductor substrate of the second semiconductor die.

18. The semiconductor device structure as claimed in claim 1, wherein the first barrier layer comprises TiN, TaN, Ta, Ti, and/or TiW.

* * * * *